(12) United States Patent
Arimoto

(10) Patent No.: US 7,242,699 B2
(45) Date of Patent: Jul. 10, 2007

(54) WAVELENGTH TUNABLE SEMICONDUCTOR LASER APPARATUS

(75) Inventor: Hideo Arimoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/338,720

(22) Filed: Jan. 25, 2006

(65) Prior Publication Data

US 2006/0203858 A1    Sep. 14, 2006

(30) Foreign Application Priority Data

Mar. 14, 2005    (JP) .............................. 2005-070376

(51) Int. Cl.
*H01S 3/10*    (2006.01)

(52) U.S. Cl. ............................ 372/20; 372/22; 372/23; 372/26

(58) Field of Classification Search .................. 372/20, 372/29.015, 29.021, 46.01, 64
See application file for complete search history.

(56) References Cited

U.S. PATENT DOCUMENTS

| | | | | |
|---|---|---|---|---|
| 4,878,724 | A * | 11/1989 | Thaniyavarn | ................... 385/3 |
| 5,282,260 | A * | 1/1994 | Buchal et al. | ............... 385/132 |
| 5,394,489 | A * | 2/1995 | Koch | ........................... 385/14 |
| 5,473,722 | A * | 12/1995 | Sohler et al. | ................ 385/132 |
| 5,805,755 | A * | 9/1998 | Amersfoort et al. | ........ 385/131 |
| 5,887,097 | A * | 3/1999 | Henry et al. | ................... 385/39 |
| 6,434,294 | B1 * | 8/2002 | Gallo | ........................... 385/27 |
| 6,831,767 | B2 * | 12/2004 | Shigeta et al. | ............... 359/240 |
| 6,970,494 | B1 * | 11/2005 | Bendett et al. | .............. 372/102 |
| 6,996,142 | B2 * | 2/2006 | Kai et al. | ...................... 372/34 |
| 7,112,827 | B2 * | 9/2006 | Hayakawa et al. | ......... 257/116 |
| 2004/0001242 | A1 * | 1/2004 | Shigeta et al. | ............... 359/240 |

OTHER PUBLICATIONS

Naoki Fujiwara et al., "Inherently Mode-Hop-Free Distributed Bragg Reflector (DBR) Laser Array" IEEE Journal of Selected Topics in Quantum Electronics, vol. 9, No. 5, Sep./Oct. 2003, pp. 1132-1137.

* cited by examiner

*Primary Examiner*—Minsun O. Harvey
*Assistant Examiner*—Yuanda Zhang
(74) *Attorney, Agent, or Firm*—Reed Smith LLP; Stanley P. Fisher, Esq.; Juan Carlos A. Marquez, Esq.

(57) ABSTRACT

The present invention relates to wavelength tunable DBR semiconductor laser devices in which light waves generated from a plurality of laser portions (or laser channels) are combined. This type of semiconductor laser device requires that the laser channels together cover an entire desired wavelength range, allowing the oscillation wavelength to be continuously varied over this range. However, to accomplish this, it is necessary to employ highly accurate crystal growth and process techniques. Furthermore, the length of the gain region must be reduced to increase the range over which the oscillation wavelength can be continuously varied, making it difficult to achieve laser oscillation.

Two laser channels operate in combination, and a combiner combines the light waves emitted from these laser portions (or laser channels) so as to cover one entire wavelength range. Specifically, an inter-grating element distance Lgrt1 of the first laser portion is set larger or smaller than an inter-grating element distance Lgrt2 of the second laser portion by one half of the grating pitch. This allows these laser portions to exhibit different mode-hopping DBR current values appropriately adjusted against each other and thereby together cover a desired wavelength range.

8 Claims, 24 Drawing Sheets

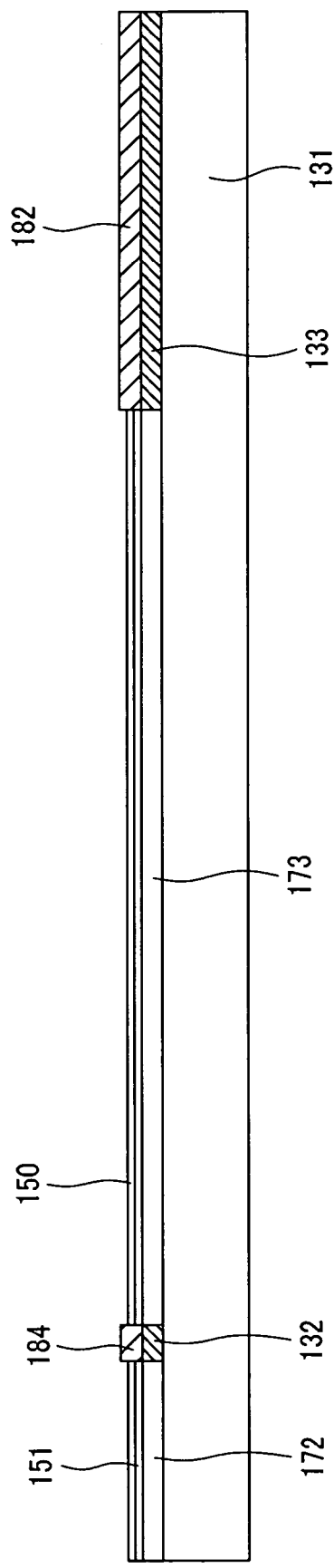
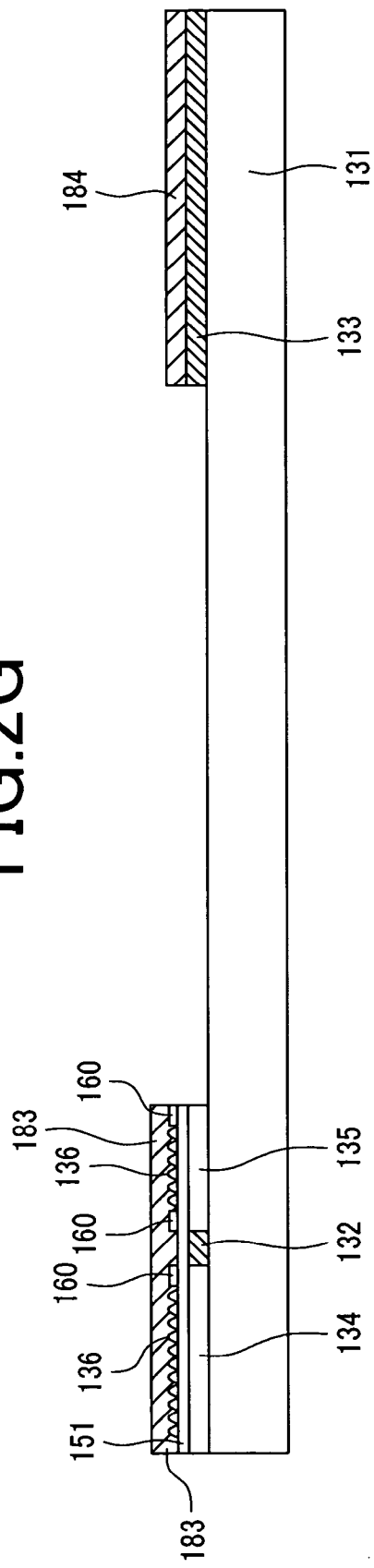

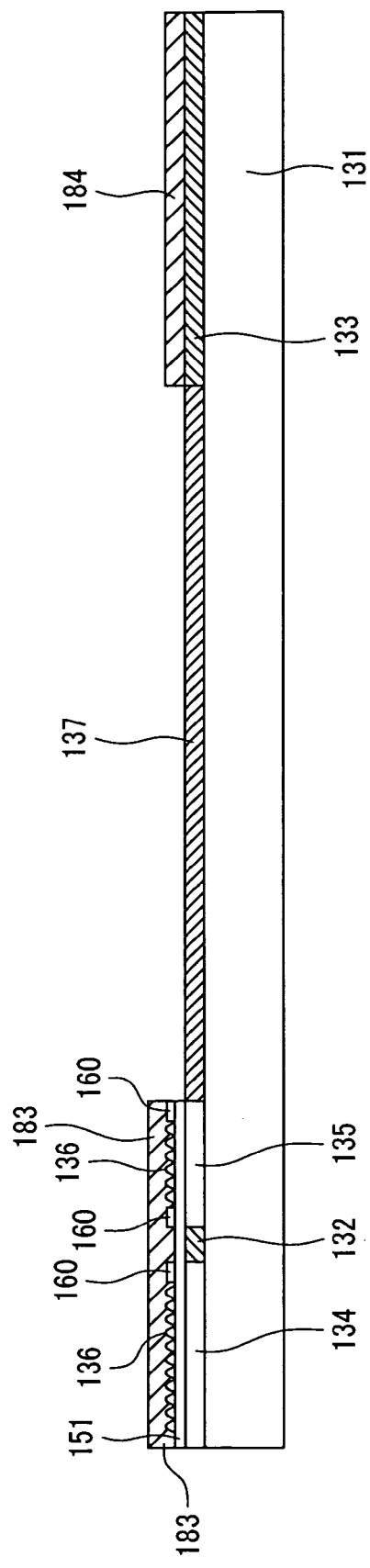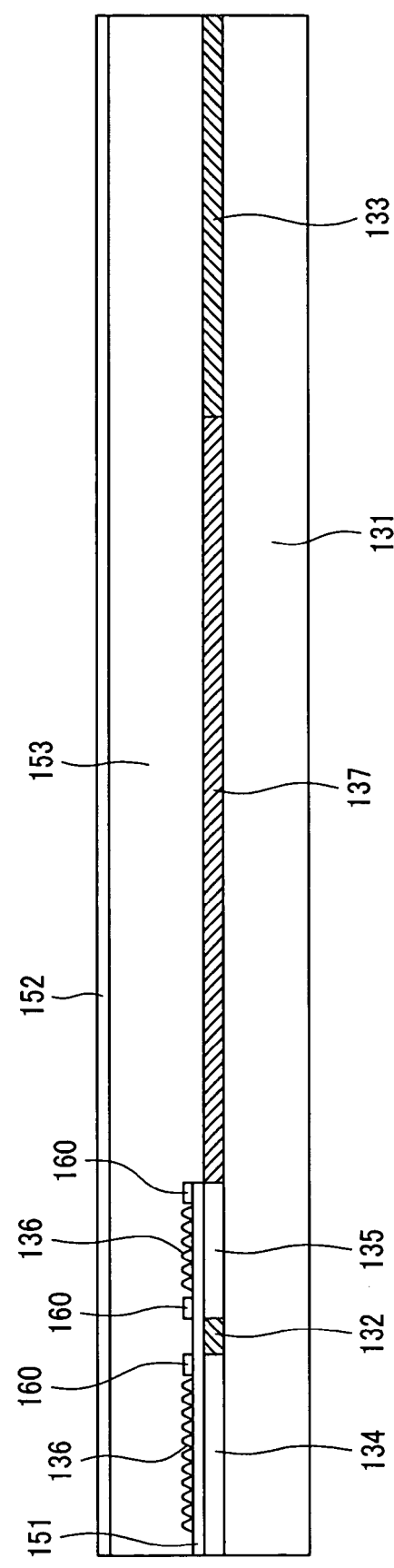

WAVELENGTH TUNABLE SEMICONDUCTOR LASER APPARATUS

CLAIM OF PRIORITY

The present application claims priority from Japanese application JP 2005-070376 filed on Mar. 14, 2005, the content of which is hereby incorporated by reference into this application.

FIELD OF THE INVENTION

The present invention relates to a semiconductor laser device in which a plurality of generated laser beams are combined to output laser light, and more particularly to an arrayed distributed Bragg reflector (DBR) laser device capable of operating as a wavelength tunable semiconductor laser to provide a given wavelength of light.

BACKGROUND ART

DBR lasers having a special grating such as an SG (Sampled Grating) or SSG (Super Structure Grating) have been developed for use as wavelength tunable semiconductor lasers to provide any wavelength within the C-band used in wavelength division multiplexer (WDM) systems. In order for these DBR lasers to oscillate at a desired wavelength, it is necessary to control currents to adjust not only the wavelength but also the phase of the light, resulting in a complicated control system. Furthermore, it has been difficult to ensure the long-term reliability of the lasers in terms of wavelength. To overcome the above problems, short cavity DBR lasers have been recently developed which do not require phase control of the light. See, for example, Selected Topics in Quantum Electronics, IEEE Journal, vol. 9, September to October 2003, pp. 1132-1137 (Nonpatent Document 1). However, the wavelength of each channel of these short cavity DBR lasers can be varied only by 10 nm or less. (This range over which the wavelength can be varied is referred to as a "wavelength tunable range".) To increase the wavelength tunable range so as to cover the entire C-band, it is necessary to array a plurality of DBR lasers. In one known semiconductor laser device, for example, the light waves from an array of DBR lasers are combined by a multi-mode interferometer (MMI) and amplified by a semiconductor optical amplifier (SOA).

FIG. 1 shows a laser chip on which a 4 channel DBR laser array, an MMI, and an SOA are monolithically integrated. This example has basically the same geometric configuration as the semiconductor laser devices of the present invention. It should be noted that the wavelength tunable semiconductor lasers of the present invention are different from conventional wavelength tunable semiconductor lasers in dimensional design, as described later in detail. In the laser chip, gain electrodes 101, 102, 103, and 104, DBR electrodes 105, 106, 107, and 108, and an SOA electrode 114 are formed on the surface of an InP substrate 100. It should be noted that in the figure, reference numerals for these electrodes (such as "101") are written beside their electrode pad portions. In the top and cross-sectional views (in FIGS. 2A to 2C described later), the portions of these electrodes directly formed in the waveguide portions, etc. are referred to as "rear DBR electrode 161", "gain electrode 162", "front DBR electrode 163", "SOA electrode 164", etc., respectively. These portions are connected to their respective electrode pads, as shown in the top view. It should be noted that in these figures, the portion of each DBR electrode on the light emitting side (or combiner side) is referred to as the "front DBR electrode", while the portion on the opposite side (or input side) is referred to as the "rear DBR electrode".

The waveguide structure is such that DBR laser channels ch1, ch2, ch3, and ch4 (or 115, 116, 117, and 118) extend in parallel to one another and are connected at the light emitting side to optical waveguides 109, 110, 111, and 112, respectively. The optical waveguides 109 to 112 are connected to an MMI combiner 113 and further connected to the SOA waveguide under the SOA electrode 114. FIG. 2A is a top view of the chip shown in FIG. 1; and FIG. 2B is a cross-sectional view of the chip shown in FIG. 2A taken along line A-B-C-D-E. Specifically, FIG. 2B shows a cross section taken along an optical path that passes through the semiconductor laser portion (from point A to point B) shown in the upper left of the figure, an optical waveguide (B-C), the optical combiner (C-D) for combining a plurality of optical waveguides, and the semiconductor optical amplifier (D-E).

The laser chip has integrated therein a rear DBR region 138, a gain region 139, a front DBR region 140, an S-shaped waveguide region 141, an MMI region 142, and an SOA region 143. The length of the gain region is reduced to 15 μm to increase the range over which the wavelength can be continuously varied (referred to as the "continuous wavelength tunable range"). Further, front and rear end faces 144 and 145 have a low reflective film coating thereon. The DBR laser portion includes a core layer 132 of the gain region, a refractive index control core layer 134 of the rear DBR region, a refractive index control core layer 135 of the front DBR region, and a grating supply layer 136. The refractive index control core layers 134 and 135 are connected to the core layer 132, and the grating supply layer 136 is formed on the refractive index control core layers 134 and 135. The refractive index control core layer 135 of the front DBR region is also connected to one end of a core layer 137 of the low-loss optical waveguide including the S-shaped waveguide region 141 and the MMI region 142. Further, a core layer 133 of the SOA region is connected to the other end of the core layer 137.

FIG. 3 shows exemplary wavelength characteristics of the laser chip shown in FIG. 1. The four DBR laser channels ch1, ch2, ch3, and ch4 handle different wavelength regions, thereby collectively covering the entire C-band. For example, to generate 1540 nm wavelength light, currents are injected to the gain layer and the SOA layer of the channel ch2 and, at the same time, a current of 50 mA is injected to the DBR layer of the channel ch2. No current is injected to the gain layers and DBR layers of the other DBR laser channels.

[Nonpatent Document]

Selected Topics in Quantum Electronics, IEEE Journal, vol. 9, September to October 2003, pp. 1132-1137.

In order to be able to generate all the wavelengths in a desired range (e.g., the C-band), the above laser chip must be configured such that the channels (ch1 to ch4) are seamlessly connected to one another in terms of wavelength. That is, the DBR current values of these channels at which mode hopping occurs must be appropriately adjusted relative to one another. FIG. 3 above is a diagram showing the relationship between the DBR current and the oscillation wavelength (of each channel). More specifically, the figure shows the wavelength characteristics of the channels ch1, ch2, ch3, and ch4 that cover different wavelength regions.

As shown in the figure, there is a jump in the wavelength characteristic curve of each channel (i.e., mode hopping) at approximately 10 mA.

To appropriately adjust the mode-hopping DBR current values of the channels relative to one another, the refractive index of each DBR layer must be set with an accuracy of ±0.002 or better and a distance Lgrt (described below) must set with an accuracy of ±0.02 μm. The distance Lgrt refers to the distance between the center portion of the one of rear grating elements closest to the gain region 139 and the center portion of the one of front grating elements closest to the gain region (wherein the rear grating elements and the front grating elements are formed in the rear DBR region and the front DBR region, respectively, and make up the grating 136). Specifically, the thickness of each DBR layer must be set with an accuracy of ±6 nm and the composition wavelength of each DBR layer must be set with an accuracy of ±10 nm, requiring highly accurate crystal growth and process techniques.

Another problem is that increasing the continuous wavelength tunable range requires the length Lgain of the gain region 139 to be reduced, making it difficult to achieve laser oscillation. FIG. 4 shows calculated values indicating the dependence of the continuous wavelength tunable range Δλcon on the distance Lgrt. It should be noted that in this example, the grating 136 is divided into two grating portions (made up of rear grating elements and front grating elements, respectively) formed within the rear DBR region 138 and the front DBR region 140, respectively, and each grating portion is spaced 5 μm apart from the gain region 139. (These grating portions sandwich the gain region 139.) The distance Lgrt is related to the length Lgain by the following equation.

$$Lgrt = Lgain + 10 \, \mu m \quad (1)$$

It should be noted that the above continuous wavelength tunable range curve shown in FIG. 4 was obtained by assuming that the optical coupling coefficient κ of the grating 139 is 90 cm$^{-1}$. Thus, FIG. 4 shows an exemplary relationship between the distance Lgrt and the range over which the oscillation wavelength can be continuously varied. As be seen from FIG. 4, the distance Lgrt must be set to less than 25 μm (that is, the length Lgain must be set to less than 15 μm) to achieve a continuous wavelength tunable range of more than 10 nm. This requirement is very difficult to meet if laser oscillation is to be produced. Therefore, practically, such a structure is not suitable for mass production.

SUMMARY OF THE INVENTION

The present invention has been devised to solve the above practical problems. According to the present invention, two laser devices operate in combination, and a combiner combines the light waves emitted from these laser devices (or laser portions) so as to cover one entire wavelength region. Specifically, when these two laser devices are DBR laser devices, an inter-grating element distance Lgrt1 of the first laser device (or laser portion) is set larger or smaller than an inter-grating element distance Lgrt2 of the second laser device (or laser portion) by one half of the grating pitch. This allows these laser devices (or laser portions) to exhibit different mode-hopping DBR current values appropriately adjusted against each other and thereby together cover a desired wavelength range.

Essential features of the present invention are as follows. The present invention provides a wavelength tunable semiconductor laser device comprising: a first semiconductor laser portion and a second semiconductor laser portion; a first optical waveguide and a second optical waveguide connected to outputs of the first and second semiconductor laser portions, respectively; and an optical combiner for combining light waves output from the first and second optical waveguides; wherein the oscillation wavelengths of the first and second semiconductor laser portions can be controlled; wherein the oscillation wavelength of the first semiconductor laser portion can be continuously varied between wavelengths λ1 and λ2 and between wavelengths λ3 and λ4, where λ1<λ2<λ3<λ4; and wherein the oscillation wavelength of the second semiconductor laser portion can be continuously varied between wavelengths λ5 and λ6 that satisfy the relation: λ5<λ2<λ3<λ6.

The first and second semiconductor laser portions can each typically have two different configurations. According to a first aspect of the present invention, a semiconductor laser device is configured such that the first and second semiconductor laser portions (or laser channels) each include a front DBR region, a gain region, and a rear DBR region (wherein the optical waveguide, the front DBR region, the gain region, and the rear DBR region are adjacent each other in that order). According to a second aspect of the present invention, the first and second semiconductor laser portions each include a front DBR region, a gain region, and a semiconductor end face having a reflective film coating thereon (wherein the optical waveguide, the front DBR region, the gain region, and the semiconductor end face are adjacent each other in that order). It goes without saying that the reflective film has a degree of reflectance that allows for laser oscillation. Specifically, a film having a reflectance of as high as approximately 70% or more is used as the above reflective film.

The present invention will now be described in detail by focusing on the above essential features and configurations. FIG. 5 shows exemplary wavelength dependence of the channels ch1 and ch2 (or exemplary oscillation wavelength characteristics of the channels ch1 and ch2). The horizontal axis represents the DBR current and the vertical axis represents the oscillation wavelength. The characteristics shown in FIG. 5 can be achieved by a laser device having a configuration as shown in FIGS. 1, 2A, and 2B. Its design specifications are different from those of conventional wavelength tunable semiconductor lasers, as described above. These specifications (for delivering the characteristics shown in FIG. 5) will now be described. Listed below are symbols used in the following description.

(1) Lgrt denotes the distance between the substantially center portion of the one of rear grating elements closest to the gain region and the substantially center portion of the one of front grating elements closest to the gain region (wherein the rear and front grating elements are formed in the rear and front DBR regions, respectively, and made up one entire grating). It should be noted that the suffix "1" (or "2") may be appended to the symbol "Lgrt" to indicate the first semiconductor laser portion (or the second semiconductor laser portion).

In FIG. 2B, the double-arrowed line indicates the distance Lgrt (or Lgrt1 or Lgrt2). Thus, these symbols indicate the distance between the substantially center portions of two grating elements: the one of the grating elements in the rear DBR region closest to the gain region; and the one of the grating elements in the front DBR region closest to the gain region. Practically, this distance may vary within ±0.03 μm, depending on process accuracy. It should be noted that in the example shown in FIG. 2B, the portions of a grating supply layer 170 closest to the gain region are left ungrated. (These portions are referred to as ungrated layers 160.) These portions do not contribute to the characteristics of the grating and therefore are not necessary. Therefore, the ungrated layers 160 on the gain region side may be omitted, so that the grating regions of the grating supply layer 170 directly face (or are connected to) the gain region, as in the example shown in FIG. 2C.

(2) κ denotes the coupling coefficient between the gain region and the front and rear DBR regions. It should be noted that the suffix "1" (or "2") may be appended to the symbol "κ" to indicate the first semiconductor laser portion (or the second semiconductor laser portion).

(3) Λ denotes the grating pitch.

(4) Δλcon denotes the range over which the oscillation wavelength can be continuously varied (hereinafter referred to as the "continuous wavelength tunable range").

(5) Δλhop denotes the wavelength range over which channel mode hopping occurs (hereinafter referred to as the "mode hopping range").

(6) K is defined as: Δλcon/(Δλcon+Δλhop).

(7) $\Delta\lambda_{GRID}$ denotes a fixed wavelength interval. Typical wavelength intervals include those of the wavelength grids specified by International Telecommunication Union-Telecommunication Sector (ITU-T).

In this example, the distance Lgrt1 of the channel ch1 is 80 μm, and Lgrt2 of the channel ch2 is 80.119 μm; the coupling coefficients κ of the channels ch1 and ch2 are 90 cm$^{-1}$; and the grating pitches Λ of the channels ch1 and ch2 are 0.238 μm. It should be noted that the distance Lgrt1 is set larger or smaller than the distance Lgrt2 by Λ/2. This allows the first and second semiconductor laser portions to exhibit different mode-hopping DBR current values appropriately adjusted against each other and thereby together cover a desired wavelength range (that is, the continuous wavelength tunable ranges of these laser portions collectively cover the entire desired range). Thus, a desired wavelength range can be covered by setting the difference between Lgrt1 and Lgrt2 to Λ/2, eliminating the need for adjusting the DBR layer refractive index with a high degree of accuracy. In the above example, the oscillation wavelength was able to be continuously varied over the range 1542.5 nm-1554 nm (i.e., 11.5 nm wide).

In the above example, the distance Lgrt2 is related to the distance Lgrt1 by the following equation:

$$Lgrt2 = Lgrt1 + \Lambda/2 \quad (2)$$

However, Lgrt2 may be set such that:

$$Lgrt2 = Lgrt1 + \Lambda \times (N\frac{1}{2}) \quad (3)$$

where N is an integer. This arrangement also allows the first and second semiconductor laser portions to have different continuous wavelength tunable ranges collectively covering an entire desired wavelength range. Further, the continuous wavelength tunable ranges of the channels ch1 and ch2 (or the laser portions) may be set such that they overlap each other. This enables the semiconductor laser device to exhibit a desired combined wavelength tunable range even when its grating is formed by an electron beam lithography apparatus having a tolerance of ±10%. This means that Lgrt1 and Lgrt2 may be set such that:

$$Lgrt2 - \Lambda \times (1/10) \leq Lgrt1 + \Lambda \times (N+\frac{1}{2}) \leq Lgrt2 + \Lambda \times (1/10) \quad (4)$$

There will now be described the requirement to seamlessly connect continuous wavelength tunable ranges of the channels ch1 and ch2. To achieve such connection, for example, the continuous wavelength tunable range Δλcon and the mode hopping range Δλhop (as shown in FIG. 5) must satisfy the following relationship:

$$\Delta\lambda con > \Delta\lambda hop \quad (5)$$

It should be noted that in FIG. 5, double-arrowed lines indicate the continuous wavelength tunable range Δλcon and the mode hopping range Δλhop.

If we let K=Δλcon/(Δλcon+Δλhop), then:

$$K = \Delta\lambda con/(\Delta\lambda con + \Delta\lambda hop) > 0.5 \quad (6)$$

The continuous wavelength tunable ranges of the channels ch1 and ch2 need to overlap each other to some degree and, furthermore, process variations must be taken into account. Therefore, the following relationship must be satisfied to seamlessly connect the continuous wavelength tunable ranges of the channels ch1 and ch2:

$$K = \Delta\lambda con/(\Delta\lambda con + \Delta\lambda hop) > 0.55 \quad (7)$$

FIG. 6 is a contour map showing the dependence of K (=Δλcon/(Δλcon+Δλhop)) on the distance Lgrt and the coupling coefficient κ. The horizontal axis represents the distance Lgrt, and the vertical axis represents the coupling coefficient κ. Each curve represents the contour at a particular value of K (as a function of Lgrt and κ). The shaded portions (including the border lines) in the figure satisfy the above inequality (7). It should be noted that generally the distance between each DBR electrode and the gain electrode is set to 5 μm and the length of the laser active layer must be set to 5 μm or more. Therefore, practically, the distance Lgrt is set to 15 μm or more. If the waveguide loss of the DBR regions is assumed to be 20 cm$^{-1}$ (a typical value), then the resultant reflectance is not high enough to cause laser oscillation when the value of κ is small. Specifically, when κ<30 cm$^{-1}$, the reflectance does not reach 50%, resulting in an inability to generate sufficiently large oscillation. That is, the smallest practical coupling coefficient κ is 30 cm$^{-1}$, as shown in FIG. 6. In FIG. 6, the distance Lgrt and the coupling coefficient κ are 15 μm and 30 cm$^{-1}$ at point A, 15 μm and 500 cm$^{-1}$ at point B, and 130 μm and 30 cm$^{-1}$ at point C, respectively.

As can be seen from the figure, for example, when κ is 90 cm$^{-1}$, Lgrt can be practically set to 80 μm, which is larger than conventional values, providing an advantage over conventional arrangements in terms of laser oscillation.

Although the present invention has been described with reference to DBR laser arrays, it may be applied to other types of lasers.

The inventive concept of the present invention will be more generally described with reference to FIG. 7. In the figure, the vertical axis represents the oscillation wavelength. (Each double-arrowed line indicates an oscillation wavelength range of the laser channel ch1 or ch2.) The laser device comprises: a laser ch1 and a laser ch2; and an optical combiner for combining the light waves emitted from both lasers; wherein: (1) the oscillation wavelength of the laser ch1 can be continuously varied between wavelengths λ1 and λ2 and between wavelengths λ3 and λ4 (where λ1<λ2<λ3<λ4); and (2) the oscillation wavelength of the laser ch2 can be continuously varied between wavelengths λ5 and λ6 that satisfy the relation: λ5<λ2<λ3<λ6. This arrangement allows the oscillation wavelength of the laser device to be continuously varied over a wide wavelength range (namely, between the wavelengths λ1 and λ4). It should be noted that the present invention may be extended to cover a wider wavelength range.

The present invention has been described with reference to the case where a wide combined continuous wavelength tunable range is to be achieved. However, lasers for communications only need to generate a wavelength grid having a fixed pitch $\Delta\lambda_{GRID}$, allowing the requirement expressed by the inequality (7) to be relaxed. That is, in this case, there may be wavelength ranges that are not covered by either of the two channels. Such an arrangement will be described with reference to FIG. 8. In the figure, the vertical axis represents the wavelength, and the horizontal broken lines together represent a wavelength grid having a predetermined pitch. This wavelength grid corresponds to one of the wavelength grids specified by International Telecommunication Union-Telecommunication Sector (for example, the 100 GHz pitch grid, or the approximately 0.8 nm pitch grid). Each double-arrowed vertical line indicates an oscillation wavelength range of the laser ch1 or ch2. The lasers ch1 and ch2 together cover an entire wavelength grid. Referring to the figure, in example (A), the laser ch1 covers the odd grid elements and the laser ch2 covers the even grid elements; in example (B), the laser ch1 covers the first two grid elements, the third two grid elements, and so on, and the laser ch2 covers the second two grid elements, the fourth two grid elements, and so on; in example (C), they cover three grid elements at a time in the same manner; and in example (D), they cover four grid elements at a time in the same manner. Although in every example there are wavelength ranges that are not covered by either of the two channels (that is, the above inequality (7) is not satisfied), these lasers ch1 and ch2 can together generate all the wavelengths of the entire wavelength grid and therefore these arrangements can be applied to laser devices for communications. This allows the distance Lgrt to be increased, providing an advantage over conventional arrangements in terms of laser oscillation. FIG. 9 shows exemplary wavelength characteristics of the laser channels ch1 and ch2. The wavelength grid pitch $\Delta\lambda_{GRID}$ is 0.8 nm and the laser channels ch1 and ch2 alternately cover two wavelength grid elements at a time. Other conditions are such that: Lgrt1=105 µm; Lgrt2=105.119 µm; Λ1=Λ2=0.238 µm; and κ=90 cm$^{-1}$. In this example, the generated wavelength grid includes the wavelengths of 16 grid elements (from 1540.6 nm to 1552.6 nm).

The above arrangement for generating the wavelengths of each grid element of a fixed-pitch wavelength grid may be generalized as follows. As in the above examples, a laser device comprises: a first semiconductor laser portion and a second semiconductor laser portion; a first optical waveguide and a second optical waveguide connected to outputs of the first and second semiconductor laser portions, respectively; and an optical combiner for combining the light waves output from the first and second optical waveguides. The laser device is further configured such that: the oscillation wavelengths of the first and second semiconductor laser portions can be controlled; and the first semiconductor laser portion is adapted to be able to oscillate at wavelengths $\lambda_{Grid(1)}, \lambda_{Grid(2)}, \ldots \lambda_{Grid(M)}$ and at wavelengths $\lambda_{Grid(2M+1)}, \lambda_{Grid(2M+2)}, \ldots \lambda_{Grid(3M)}$, and the second semiconductor laser portion is adapted to be able to oscillate at wavelengths $\lambda_{Grid(M+1)}, \lambda_{Grid(M+2)}, \ldots \lambda_{Grid(2M)}$, where: M is an integer; $\lambda_{Grid(1)} < \lambda_{Grid(2)} < \ldots < \lambda_{Grid(3M)}$; and $\lambda_{Grid(2)} - \lambda_{Grid(1)} = \lambda_{Grid(3)} - \lambda_{Grid(2)} = \ldots = \lambda_{Grid(3M)} - \lambda_{Grid(3M-1)} = \Delta\lambda_{GRID}$.

In the above laser devices, only one of the two laser portions (or laser channels) oscillates at a time, and which laser portion is allowed to oscillate depends on the wavelength to be generated. That is, these laser portions are controlled such that when the first laser portion oscillates, the second laser portion does not oscillate, and vice versa. Such control means or circuitry can be fully implemented in a conventional manner.

Although the present invention has been described with reference to lasers for generating wavelengths within the 1550 nm band, it can be practically applied to laser devices for communications that generate wavelengths within the communication wavelength range 1250 nm to 1620 nm.

The present invention provides a semiconductor laser device whose oscillation wavelength can be continuously varied over a wide range by using only a conventional semiconductor laser device manufacturing technique.

BRIEF DESCRIPTION OF THE DRAWINGS

FIGS. 2D to 2I are cross-sectional views illustrating sequential process steps for manufacturing the exemplary wavelength tunable semiconductor laser device of the present invention.

DETAILED DESCRIPTION OF THE PREFERRED EMBODIMENTS

First Embodiment

Figure 10:
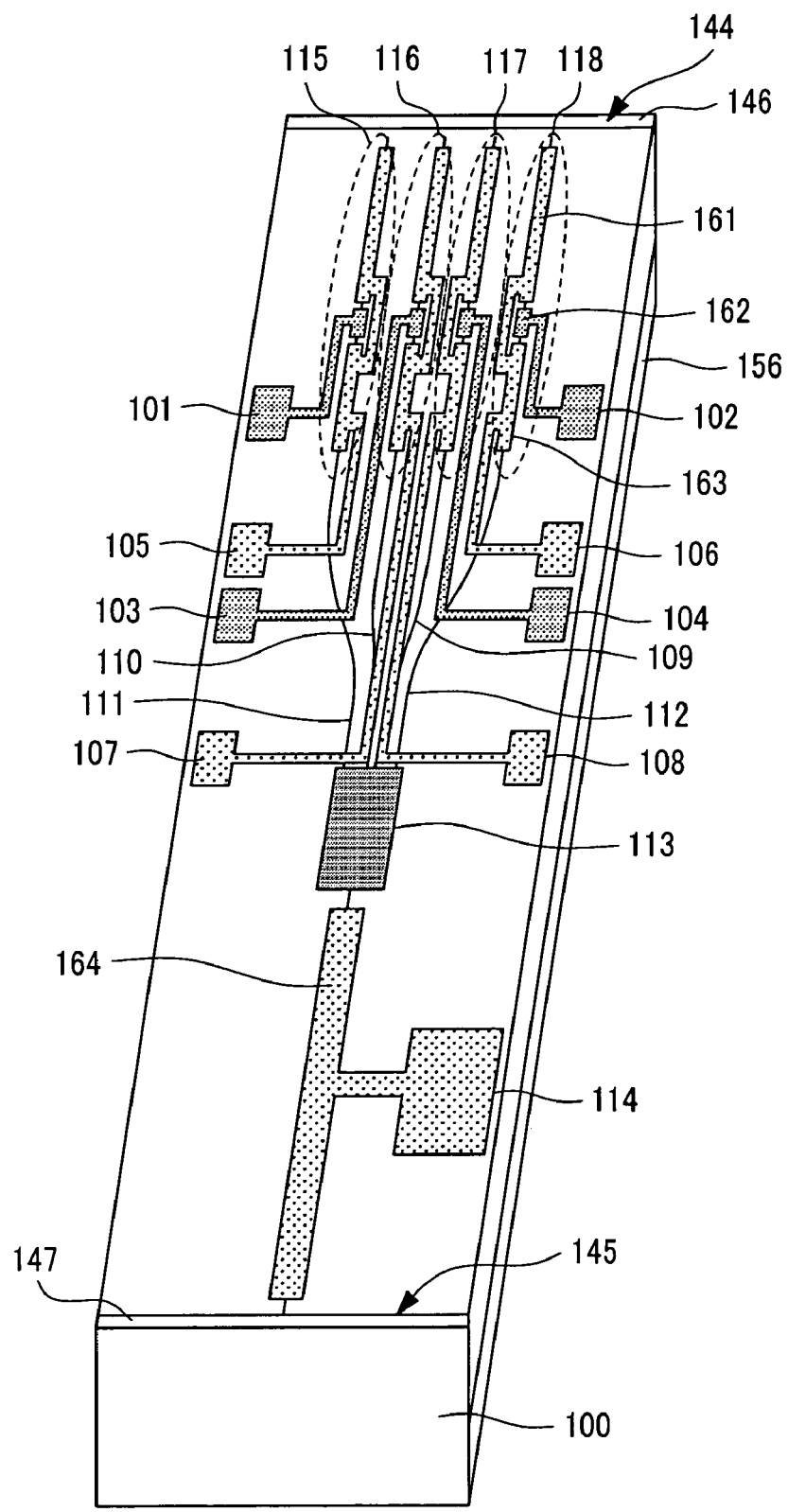
FIG. 10 is a perspective view of a wavelength tunable semiconductor laser device according to a first embodiment of the present invention.
Figure 11A:
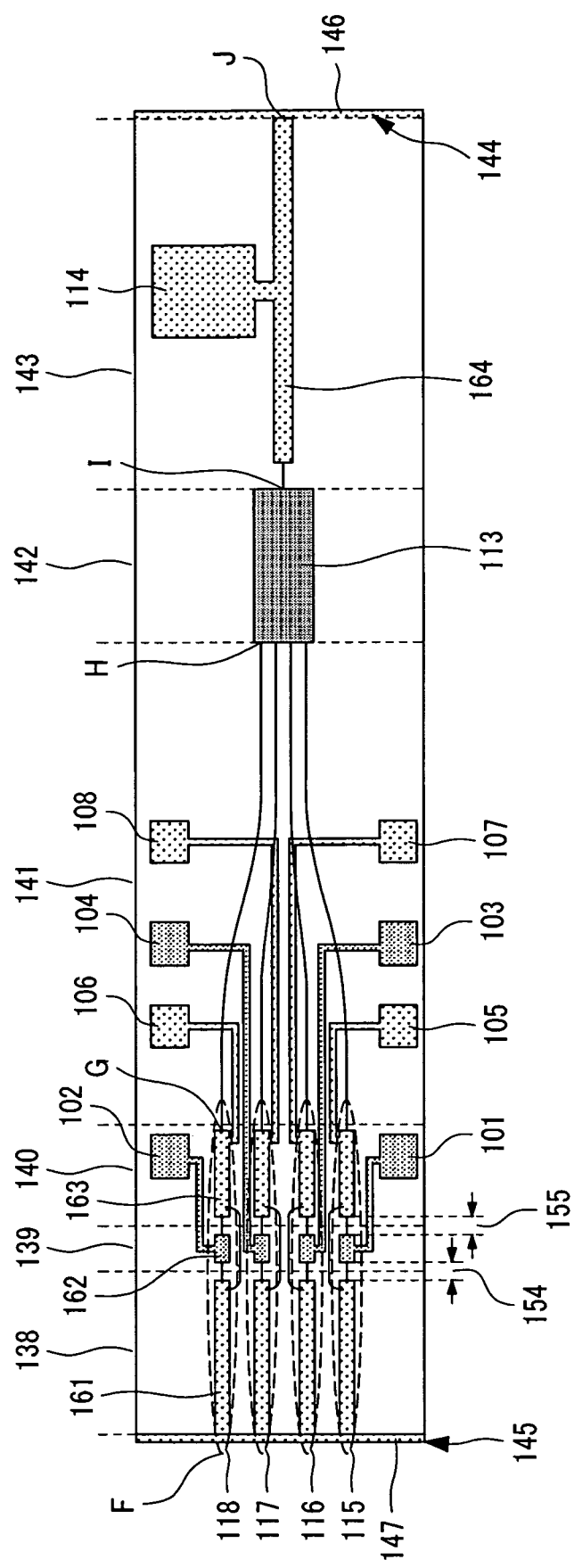
FIG. 11A is a top view of the wavelength tunable semiconductor laser device according to the first embodiment of the present invention.
Figure 11B:
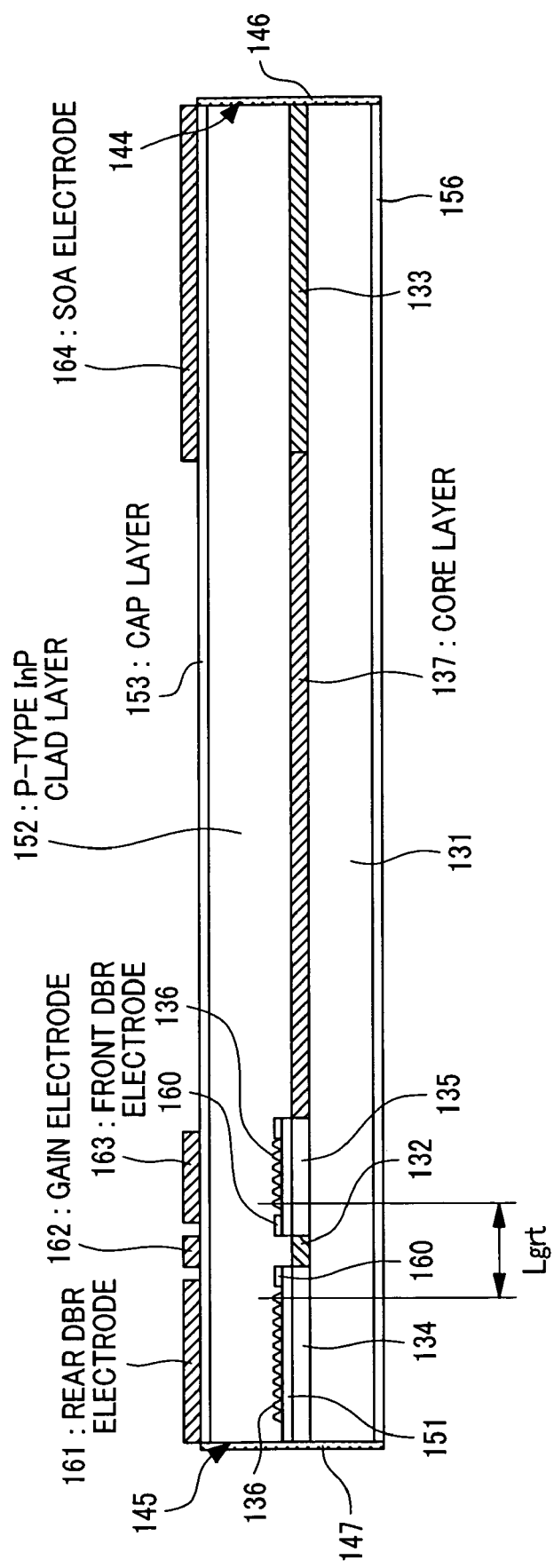
FIG. 11B is a cross-sectional view of the wavelength tunable semiconductor laser device according to the first embodiment of the present invention.

There will now be described an exemplary wavelength tunable semiconductor device whose oscillation wavelength can be varied by injecting a current into the refractive index control layer and selecting one of the DBR laser channels. This semiconductor laser device oscillates at wavelengths within the 1550 nm band. FIGS. 10, 11A, and 11B show the exemplary semiconductor laser device. FIG. 10 is a perspective view; FIG. 11A is a top view; and FIG. 11B is a cross-sectional view taken along line F-G-H-I-J of FIG. 11A. Specifically, like FIG. 2B above (showing a cross section taken along line A-B-C-D-E), FIG. 11B shows a cross section taken along an optical path that passes through the semiconductor laser portion (shown in the upper left of the figure), the gate region, an optical waveguide, the optical combiner for combining the light waves from a plurality of optical waveguides, and the semiconductor optical amplifier. The channel DBR laser array, the MMI combiner, and the SOA are monolithically integrated.

Figure 1:
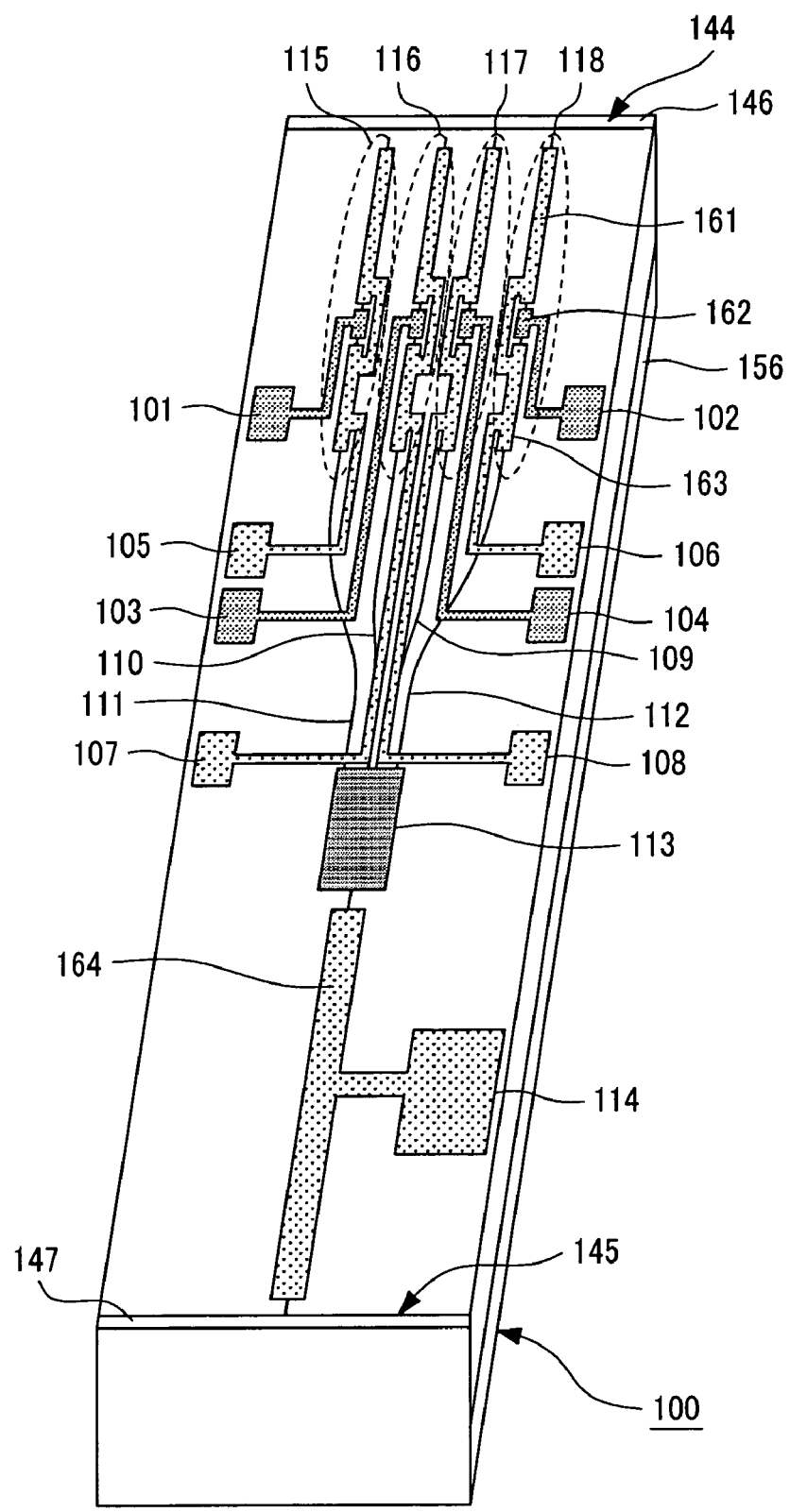
FIG. 1 is a perspective view of an exemplary wavelength tunable semiconductor laser device of the present invention.
Figure 2A:
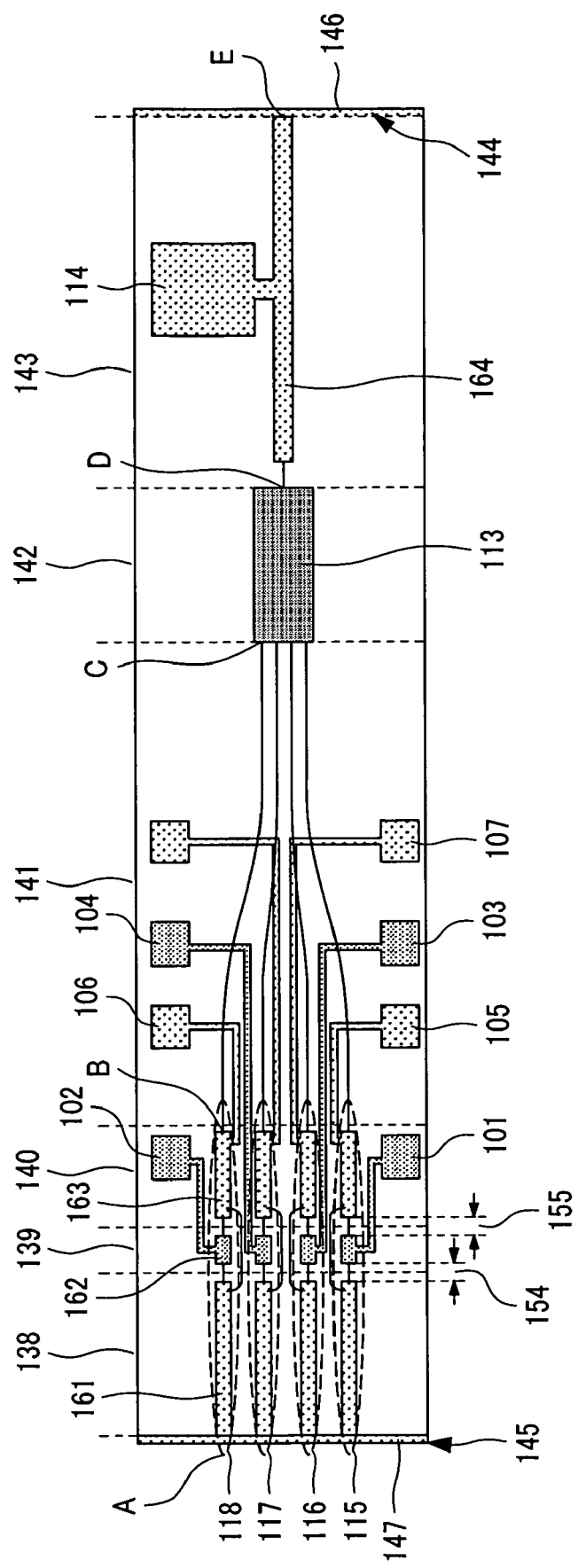
FIG. 2A is a top view of the exemplary wavelength tunable laser semiconductor device of the present invention.
Figure 2B:
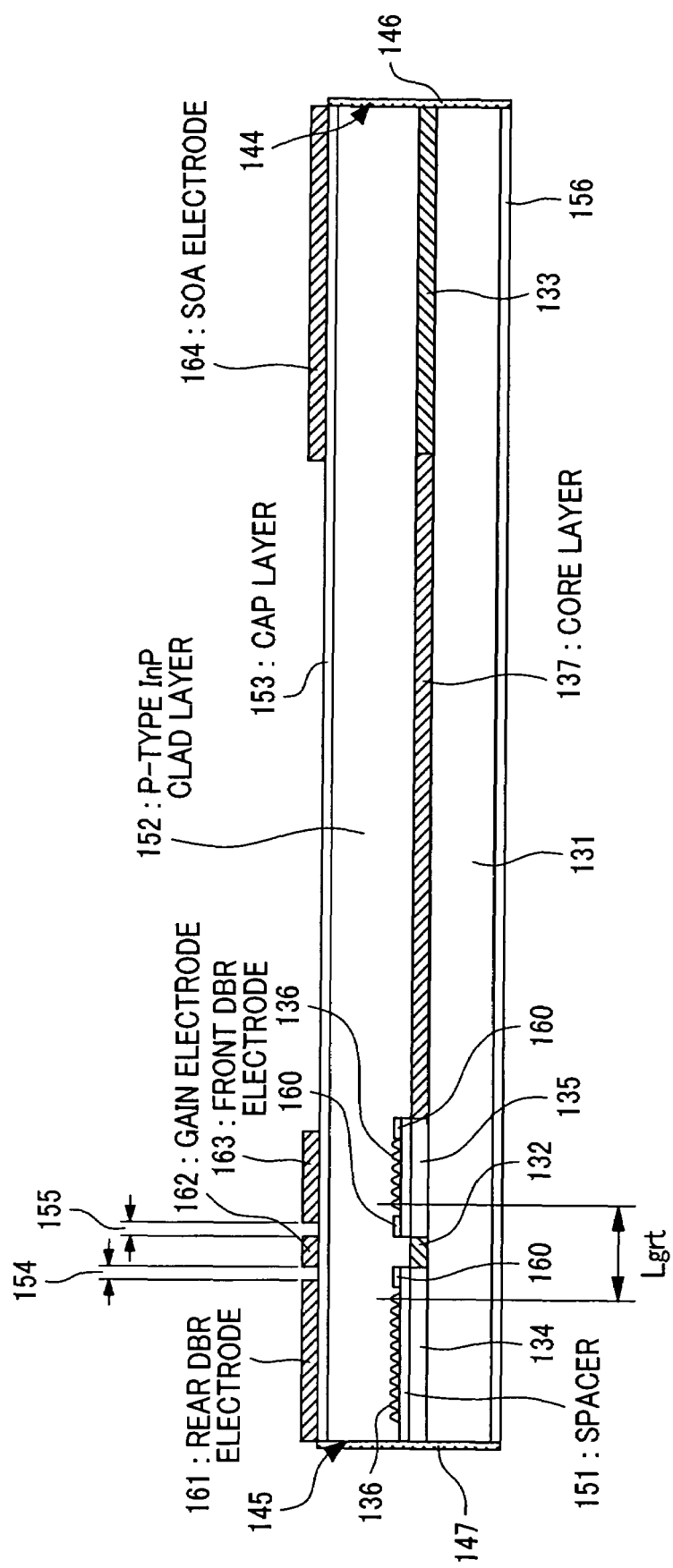
FIG. 2B is a cross-sectional view of the exemplary wavelength tunable semiconductor laser device of the present invention.
Figure 2C:
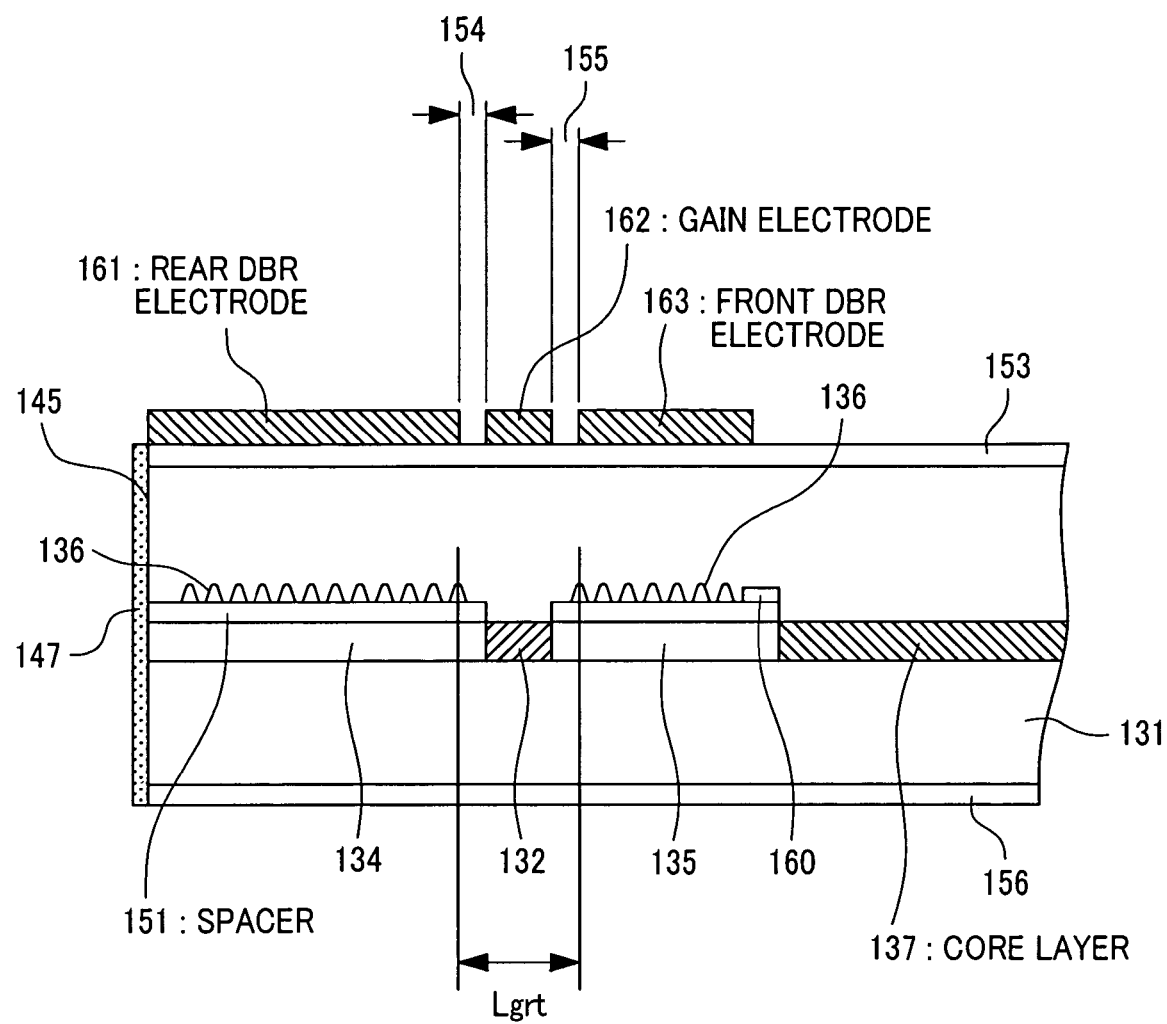
FIG. 2C is a partial cross-sectional view of a variation of the exemplary wavelength tunable semiconductor laser device of the present invention.
Figure 2D:
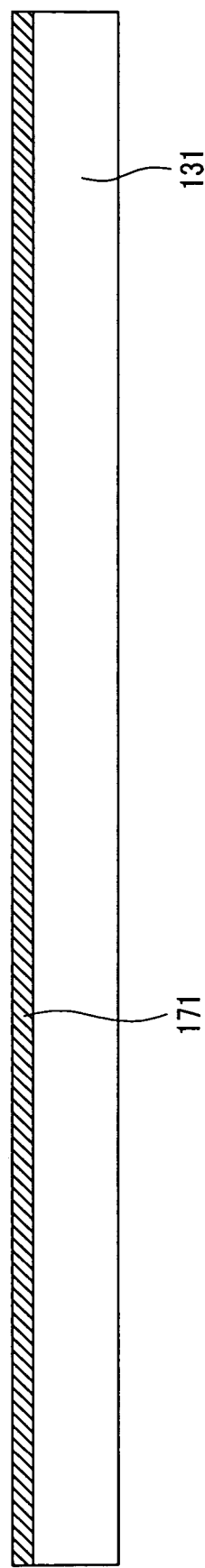
Figure 2E:
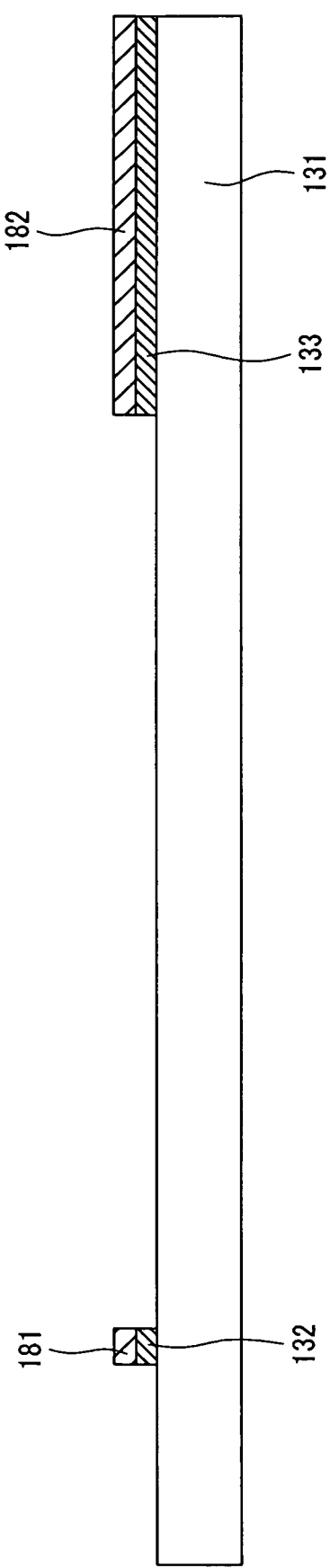
Figure 3:
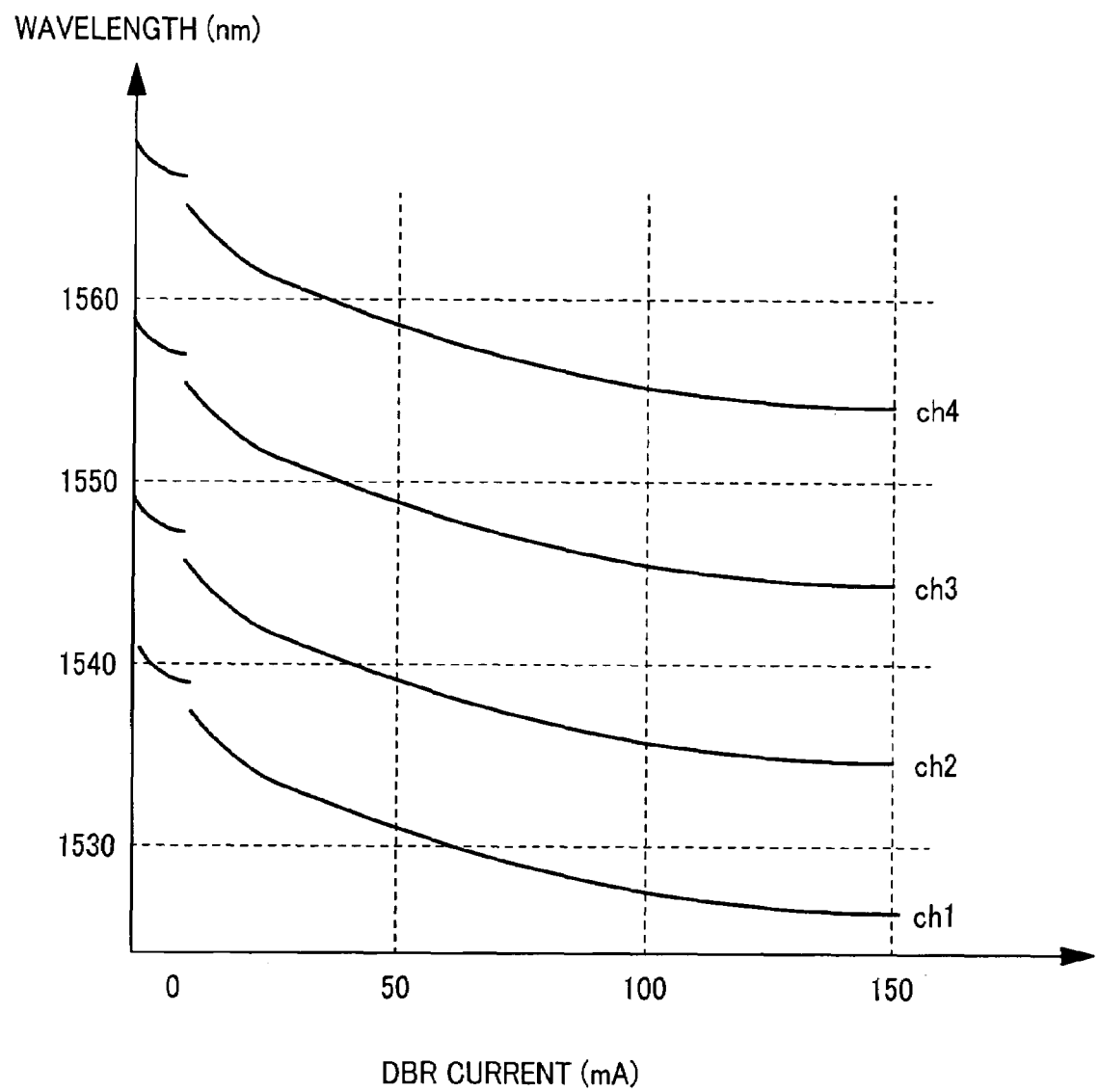
FIG. 3 is a diagram showing an exemplary relationship between the DBR current and the oscillation wavelength of a conventional wavelength tunable semiconductor laser device.
Figure 4:
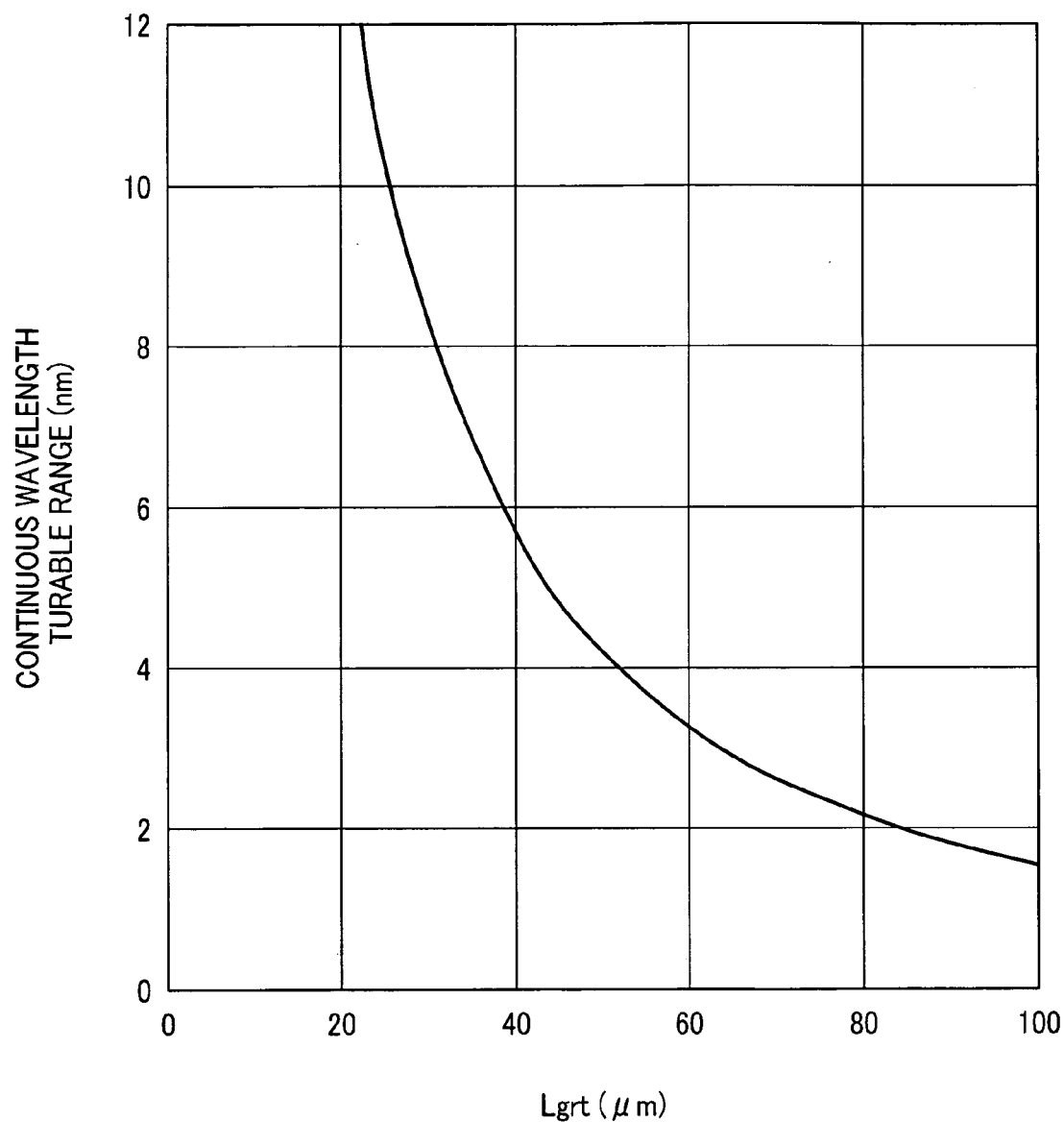
FIG. 4 is a diagram showing an exemplary relationship between a distance Lgrt and the continuous wavelength tunable range of a conventional wavelength tunable semiconductor laser device.
Figure 5:
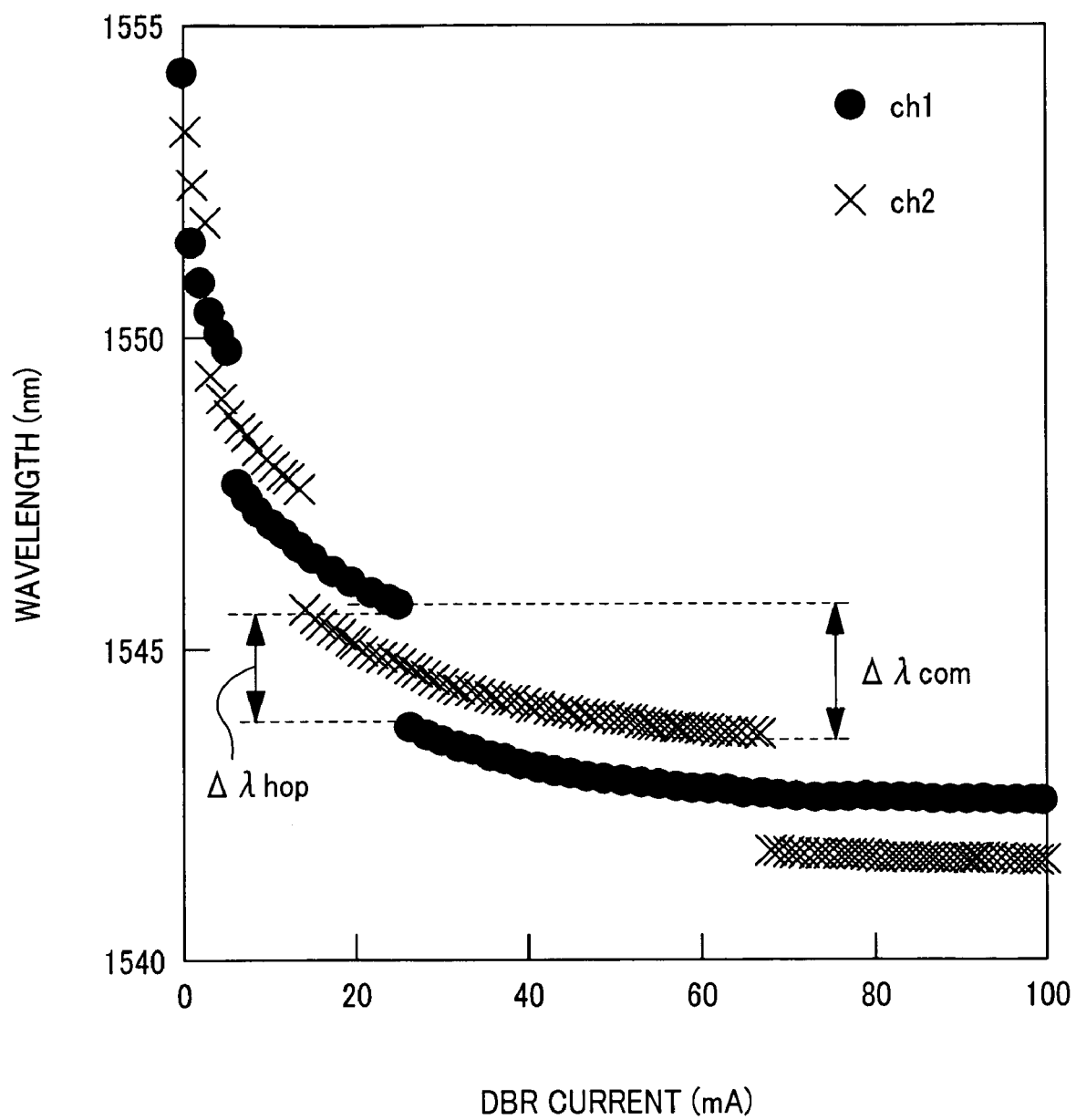
FIG. 5 is a diagram showing an exemplary relationship between the DBR current and the oscillation wavelength of the wavelength tunable semiconductor laser device of the present invention.
Figure 6:
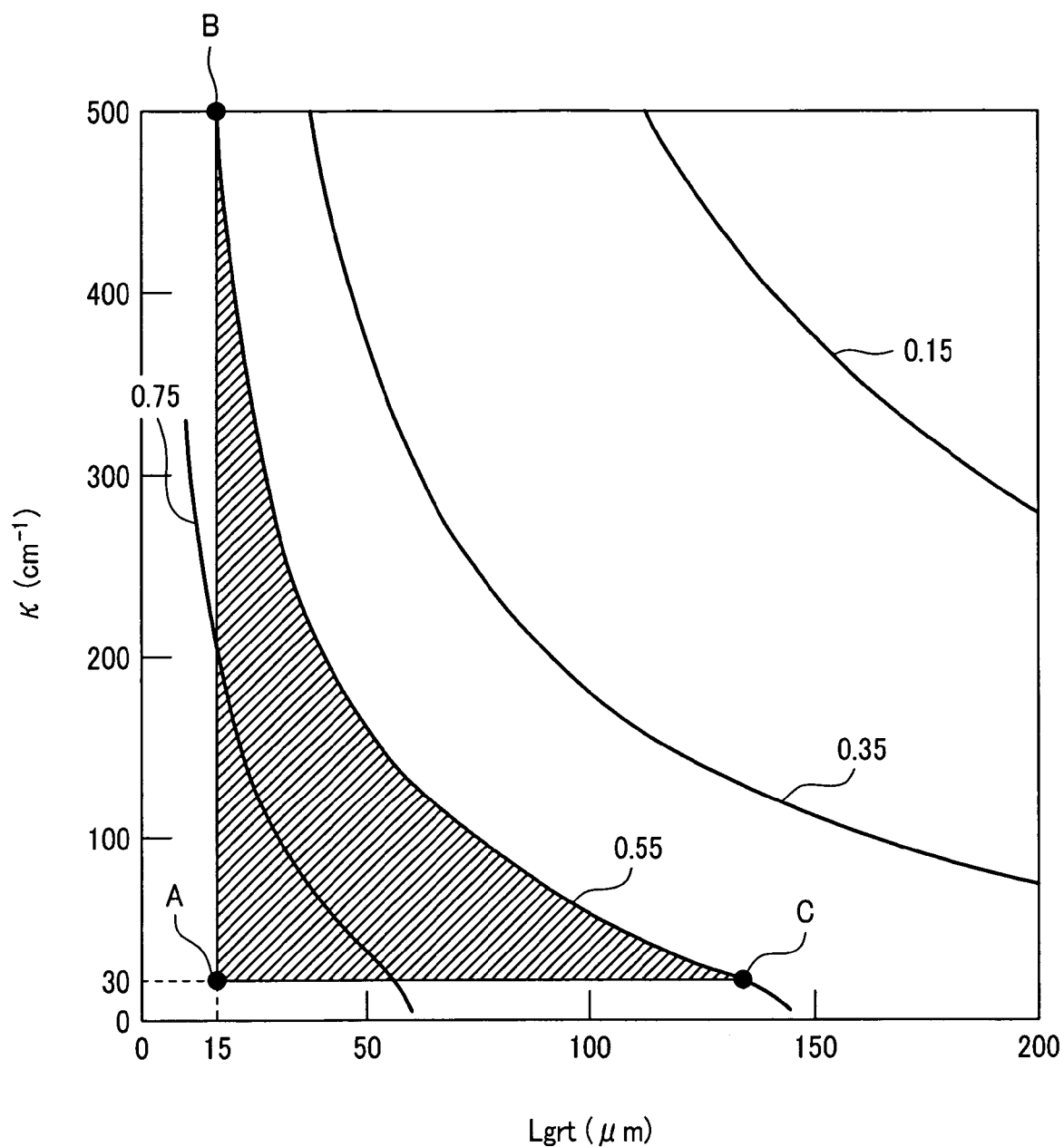
FIG. 6 is a diagram showing an exemplary relationship between a distance Lgrt and a coupling coefficient κ of the wavelength tunable semiconductor laser device of the present invention.
Figure 7:
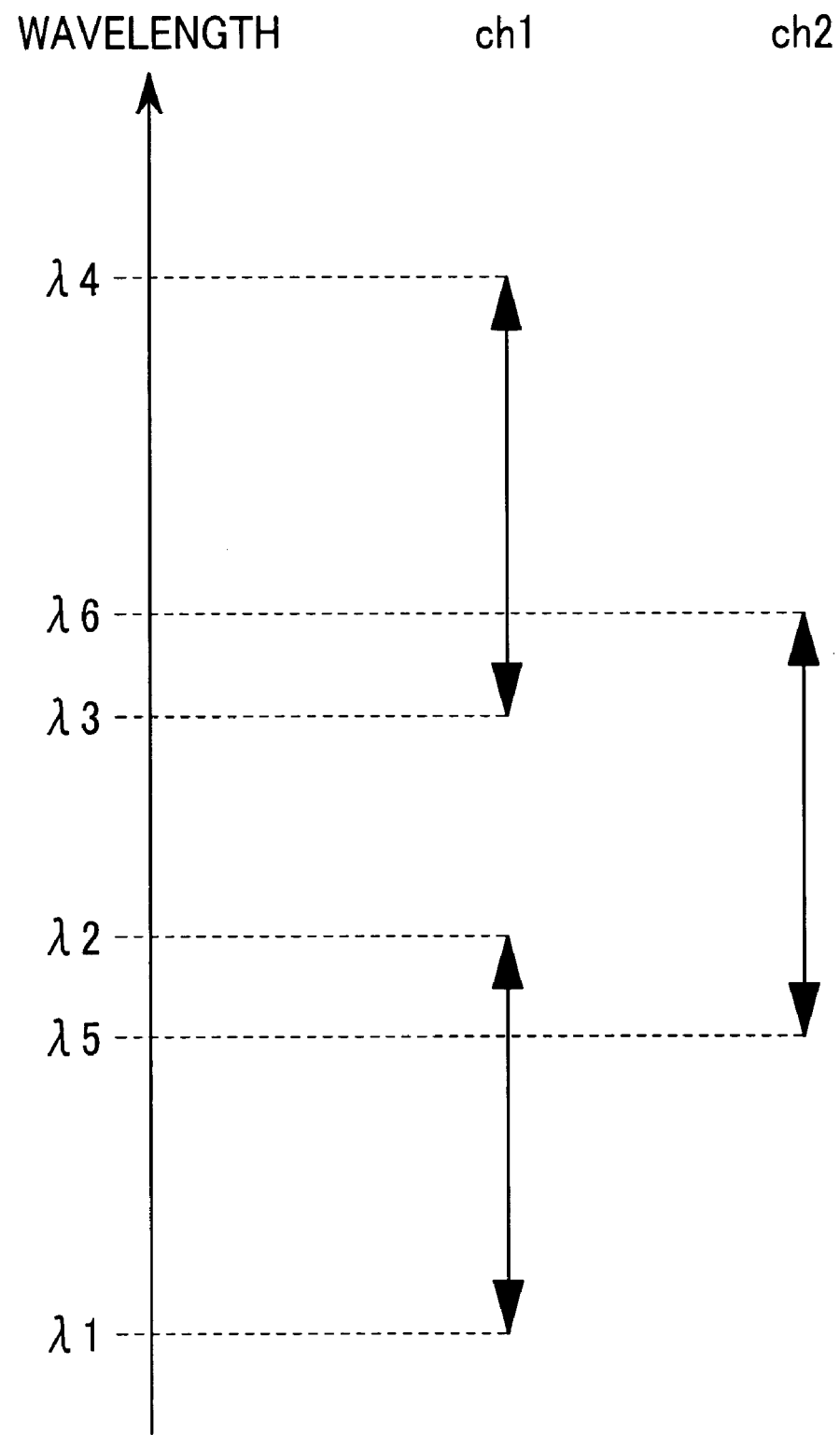
FIG. 7 is a diagram illustrating an inventive concept of the present invention.
Figure 8:
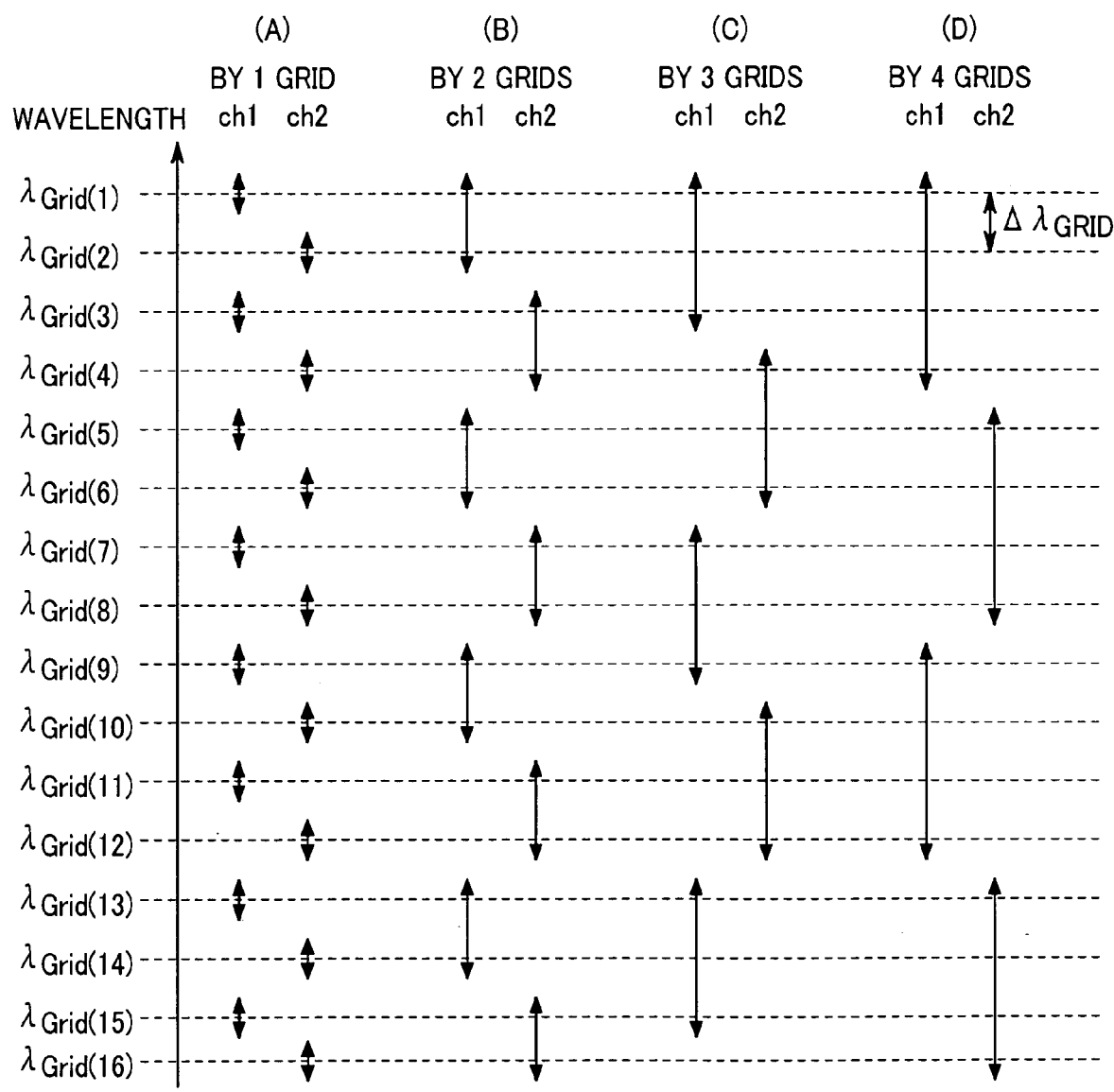
FIG. 8 is a diagram illustrating another inventive concept of the present invention.
Figure 9:
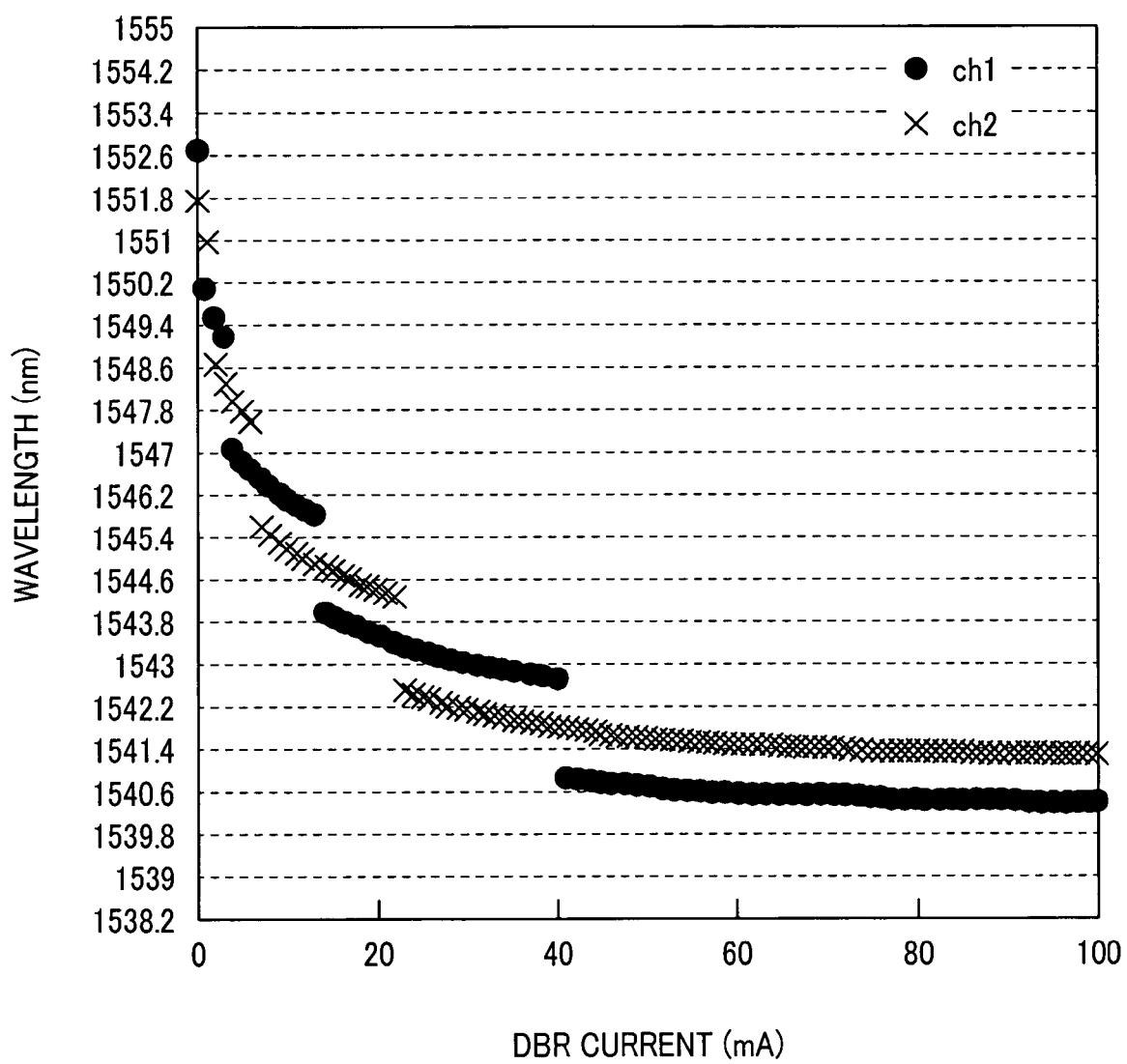
FIG. 9 is a diagram showing the DBR current and the oscillation wavelength of another wavelength tunable semiconductor laser device of the present invention adapted to provide a wavelength grid.

The manufacturing method will now be described. FIGS. 2D to 2I are cross-sectional views of the device, showing each major step of the method. It should be noted that FIG. 2B above shows the finished device. First of all, a core layer 171 made of an strained InGaAsP material and having a 10 period multiquantum well structure is grown on an n-type (100) InP semiconductor substrate 131 by metalorganic chemical vapor deposition. Portions of the core layer 171 will eventually become a core layer 132 of the gain region and a core layer 133 of the SOA region. The emission wavelength of the multiquantum well is approximately 1550 nm. After forming insulator films 181 and 182 on the core layer 171, unwanted portions of the core layer 171 are removed by selective etching using these insulator films 181 and 182 as masks, leaving the core layer 132 of the gain region and the core layer 133 of the SOA region, as shown in FIG. 2E. Then, refractive index control core layers 172 and 173, an InP spacer layer 151, and an InGaAsP grating supply layer 150 of the DBR region are formed sequentially by metalorganic chemical vapor deposition using a known technique of directly joining different types of waveguides together, as shown in FIG. 2F. (The refractive index control core layers 172 and 173 have a thickness of 0.4 μm and a composition wavelength of 1.40 μm, the InP spacer 151 has a thickness of 50 nm, and the InGaAsP grating supply 150 has a thickness of 50 nm and a composition wavelength of 1.3 μm.) The refractive index control core layer 172 will eventually become the refractive index control core layer 134 of the InGaAsP rear DBR region, and a portion of the refractive index control core layer 173 will eventually become the refractive index control core layer 135 of the InGaAsP front DBR region.

Then, a grating pattern is formed by an electron beam lithography apparatus and applied to the grating supply layer 150. The DBR laser channel ch1 (115) and the DBR laser channel ch2 (116) must be adapted to together cover one wavelength range, and the DBR laser channel ch3 (117) and the DBR laser channel ch4 (118) must be adapted to together cover another wavelength range. Therefore, these DBR laser channels are formed such that Lgrt1=80 μm, Lgrt2=80.119 μm, Lgrt3=80 μm, and Lgrt4=80.118 μm. Further, in order to enable the channels ch1 to ch4 (115 to 118) to oscillate at different wavelengths, their grating pitches are set to 238 nm, 238 nm, 236 nm, and 236 nm, respectively, and the rear and front DBR regions of each laser channel have the same grating pitch. Further, the grating of each laser channel is formed to have a coupling coefficient $\kappa$ of 90 cm$^{-1}$.

Then, an insulator film 183 is formed on the core layers 132, 134, and 135, and an insulator film 184 is formed on the core layer 133. After that, selective etching is carried out using these insulator films as masks to remove unwanted portions, leaving the core layers 132, 133, 134, and 135, as shown in FIG. 2G. Then, a core layer 137 of an InGaAsP low-loss optical waveguide having a composition wavelength of 1.3 μm is formed by metalorganic chemical deposition using a known technique of directly joining different types of waveguides together, as shown in FIG. 2H.

Then, a p-type cladding layer 152 and a high concentration p-type InGaAs capping layer 153 are sequentially formed by metalorganic chemical vapor deposition to thicknesses of 1.5 μm and 0.2 μm, respectively, as shown in FIG. 2I.

Then, the optical waveguides are formed by a conventional selective dry etching technique using a mask having a stripe shape. See the top view shown in FIG. 11A showing the layout of the optical waveguides. Then, Fe-doped InP is selectively buried by metalorganic chemical vapor deposition. The width of the mesa as viewed in the light traveling direction is 1.3 μm. As a result, this step forms the rear DBR region 138, the gain region 139, the front DBR region 140, the S-shaped waveguide region 141, the MMI region 142, and the SOA region 143 having thicknesses of 300 μm, 70 μm, 120 μm, 100 μm, 500 μm, 200 μm, and 600 μm, respectively. It should be noted that the total length of the laser chip is 2000 μm.

Then, electrodes 103 to 108 and 114 are formed on the chip surface to supply a current to each region, as shown in FIG. 11A. Separation regions 154 and 155 having a width of 5 μm are provided between the electrodes of the rear DBR region 138 and the gain region 139 and between the electrodes of the gain region 139 and the front DBR region 140, respectively. In FIG. 11B, reference numeral 161 denotes the rear DBR electrode; 162, the gain electrode; 163, the front DBR electrode; and 164, the SOA electrode.

A common electrode 156 is formed on the chip back surface. Then, after cutting out a 2000 μm long laser chip, low reflective films 146 and 147 having a reflectance of 0.01% are formed on the front end face 144 and the rear end face 145 of the laser chip, respectively, as shown in FIG. 2B.

Figure 12:
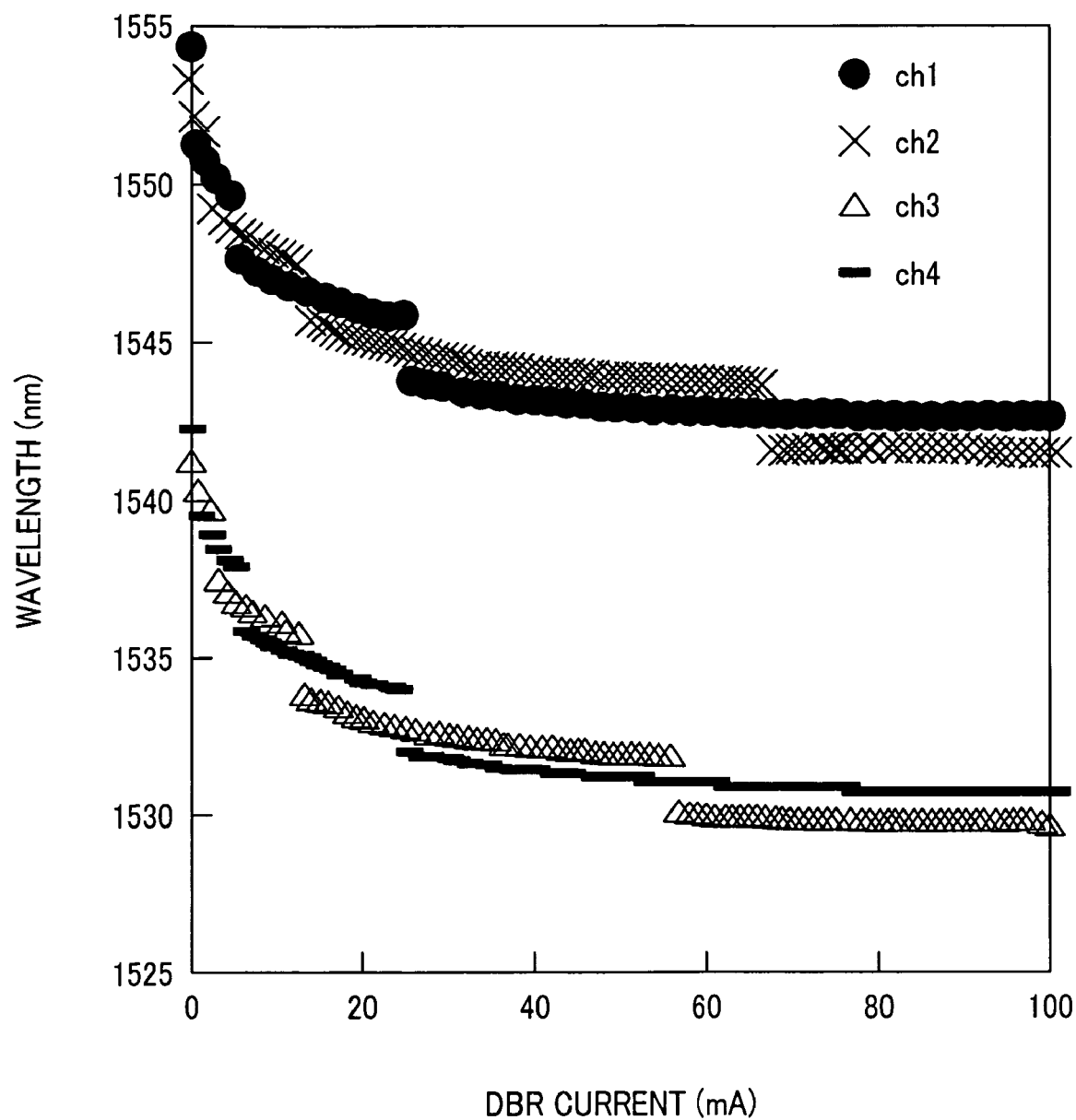
FIG. 12 is a diagram showing an exemplary relationship between the DBR current and the oscillation wavelength of the wavelength tunable semiconductor laser device according to the first embodiment of the present invention.

We produced a distributed Bragg reflector laser using the above method. All of the four channels of this laser oscillated in a single axial mode at wavelengths within the 1550 nm band. The laser chip delivered a chip optical output of approximately 30 mW at a gain current of 20 mA and an SOA layer current of 200 mA. (This magnitude of optical output is large enough for optical communications.) FIG. 12 shows the wavelength characteristics of the laser chip. As described above, all of the four channels of the produced distributed Bragg reflector laser oscillated in a single axial mode at wavelengths within the 1550 nm band. The optical output of the laser chip was approximately 30 mW (large enough for optical communications) at a gain current of 20 mA and an SOA layer current of 200 mA, as described above. When the DBR current was changed from 0 to 100 mA, the laser chip exhibited the following characteristics. The channels ch1 and ch2 together covered the wavelength range 1542.5 nm to 1554 nm (i.e., 11.5 nm wide), allowing the oscillation wavelength to be continuously varied over this range. Likewise, the channels ch3 and ch4 together covered the wavelength range 1531.5 nm to 1543 nm (i.e., 11.5 nm wide), allowing the oscillation wavelength to be continuously varied over this range. As a result, the laser chip achieved a continuous wavelength tunable range extending between 1531.5 nm and 1554 nm (i.e., 22.5 nm wide).

While the present embodiment has been described as applied to a DBR laser array having 4 channels, it is to be understood that this should not be construed as limiting the invention. The DBR laser array may include any even number of channels (for example, 6, 8, or 10 channels). Further, although the present embodiment has been described with reference to a buried structure laser formed of InGaAsP material, the invention can be applied to a buried structure laser made of any semiconductor material such as InGaAlAs, GaInNAs, InGaAs, or InGaAlP. Further, the present invention can be applied to not only buried structure lasers but also ridge waveguide structure lasers and buried ridge structure lasers (that is, the present invention is not limited to transverse-mode confining structures for laser oscillation). Still further, the present invention is not limited to any particular oscillation wavelength or wavelength band (such as the 1550 nm band). For example, the present invention can be applied to wavelengths from 1250 nm to 1620 nm typically used for communications and hence is very practical.

Second Embodiment

Figure 13A:
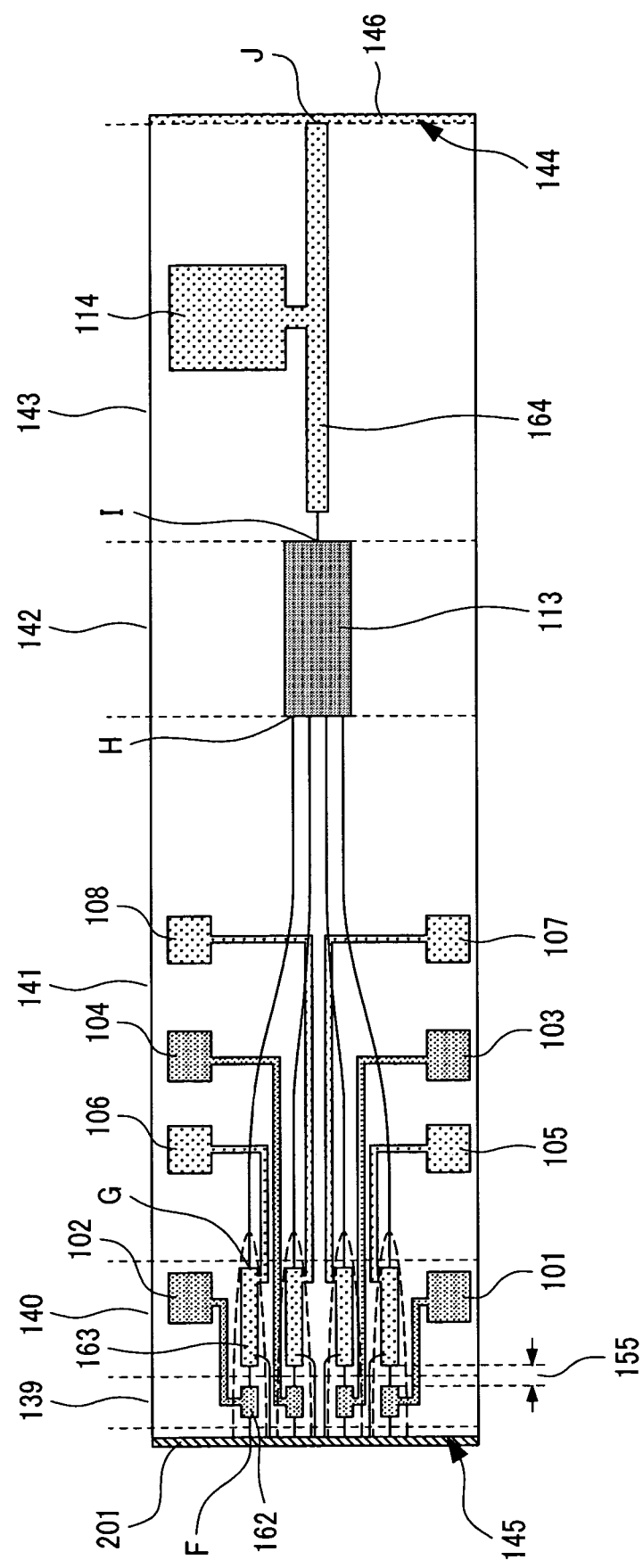
FIG. 13A is a top view of a wavelength tunable semiconductor laser device according to a second embodiment of the present invention.
Figure 13B:
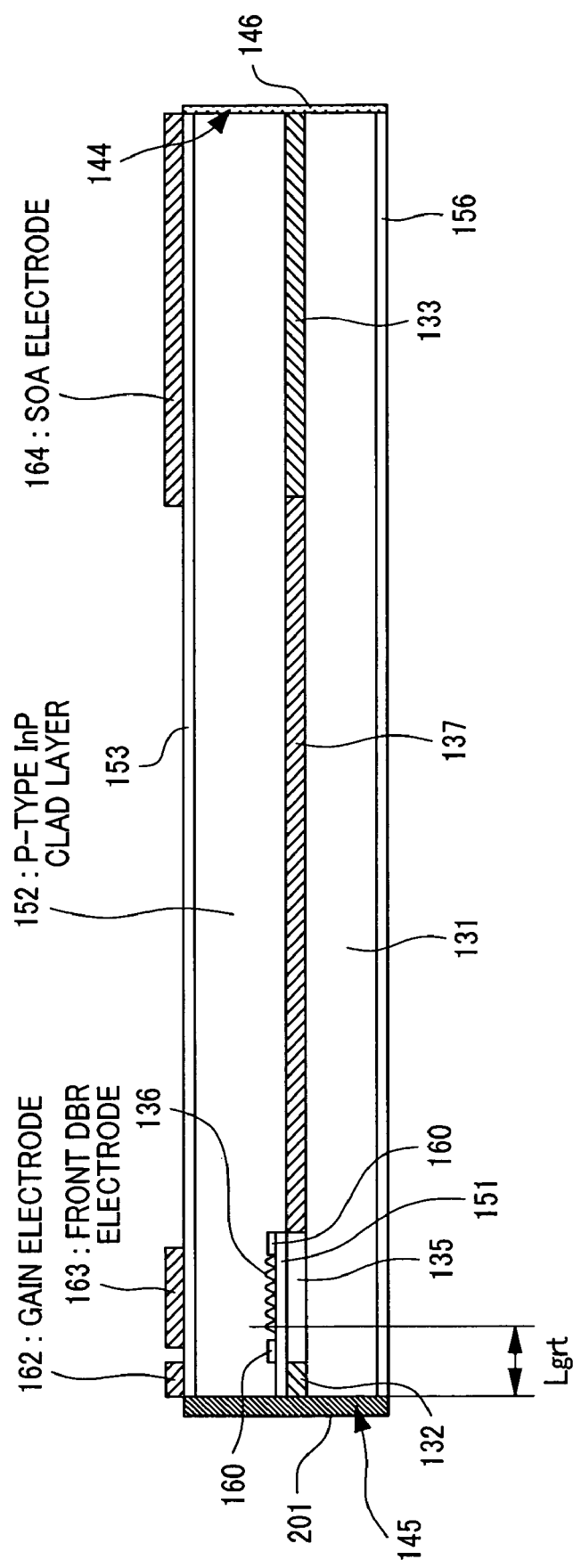
FIG. 13B is a cross-sectional view of the wavelength tunable semiconductor laser device according to the second embodiment of the present invention.

With reference to FIGS. 13A and 13B, there will now be described another exemplary wavelength tunable semiconductor device for the 1550 nm band whose oscillation wavelength can be varied by injecting a current into the refractive index control layer and selecting one of the DBR laser channels. FIG. 13A is a top view of the device and FIG. 13B is a cross-sectional view taken along line F-G-H-I-J of FIG. 13A.

The second embodiment is different from the first embodiment in that the laser device of the second embodiment does not include the rear DBR region 138 but instead includes a high reflective film 201 formed on a semiconductor end face. All other components are basically similar to those described with reference to the first embodiment. It should be noted that eliminating the rear DBR region 138 allows the DBR current to be reduced to approximately half.

The symbol Lgrt1 denotes the distance between the high reflective film 201 of the DBR laser channel ch1 (or 115) and the substantially center portion of the one of the grating elements for the channel ch1 (formed in the front DBR region 140) closest to the gain region. This distance Lgrt1 is set to 80 µm. Further, the grating (for channel ch1) in the front DBR region 140 is formed to have a coupling coefficient ($\kappa 1$) of 90 cm$^{-1}$ and a grating pitch ($\Lambda 1$) of 0.238 µm. On the other hand, the symbol Lgrt2 denotes the distance between the high reflective film 201 of the DBR laser channel ch2 (or 116) and the substantially center portion of the one of the grating elements for the channel ch2 (formed in the front DBR region 140) closest to the gain region. This distance Lgrt2 is set larger than the distance Lgrt1 by one half of the grating pitch $\Lambda 1$ (that is, Lgrt2 is 80.119 µm). Further, the grating (for the channel ch2) is formed in the front DBR region 140 such that its coupling coefficient $\kappa 2$ is the same as the coupling coefficient $\kappa 1$ (90 cm$^{-1}$) and its grating pitch $\Lambda 2$ is the same as the grating pitch $\Lambda 1$ (0.238 µm).

Likewise, in the case of the DBR laser channel ch3 (or 117), the symbol Lgrt3 denotes the distance between the high reflective film 201 of the DBR laser channel ch3 (or 117) and the substantially center portion of the one of the grating elements for the channel ch3 (formed in the front DBR region 140) closest to the gain region. This distance Lgrt3 is set to 80 µm. The grating (for the channel ch3) in the front DBR region 140 is formed to have a coupling coefficient ($\kappa 3$) of 90 cm$^{-1}$ and a grating pitch ($\Lambda 3$) of 0.236 µm. As for the DBR laser channel ch4 (or 118), the symbol lgrt4 denotes the distance between the high reflective film 201 of the DBR laser channel ch4 (or 118) and the substantially center portion of the one of the grating elements for the channel 4 (formed in the front DBR region 140) closest to the gain region. This distance Lgrt4 is set larger than the distance Lgrt3 by one half of the grating pitch $\Lambda 3$ (that is, Lgrt4 is 80.118 µm). Further, the grating (for the channel ch4) is formed such that its coupling coefficient $\kappa 4$ is the same as the coupling coefficient $\kappa 3$ (90 cm$^{-1}$) and its grating pitch ($\Lambda 4$) is the same as the grating pitch $\Lambda 3$ (0.236 µm).

Figure 14:
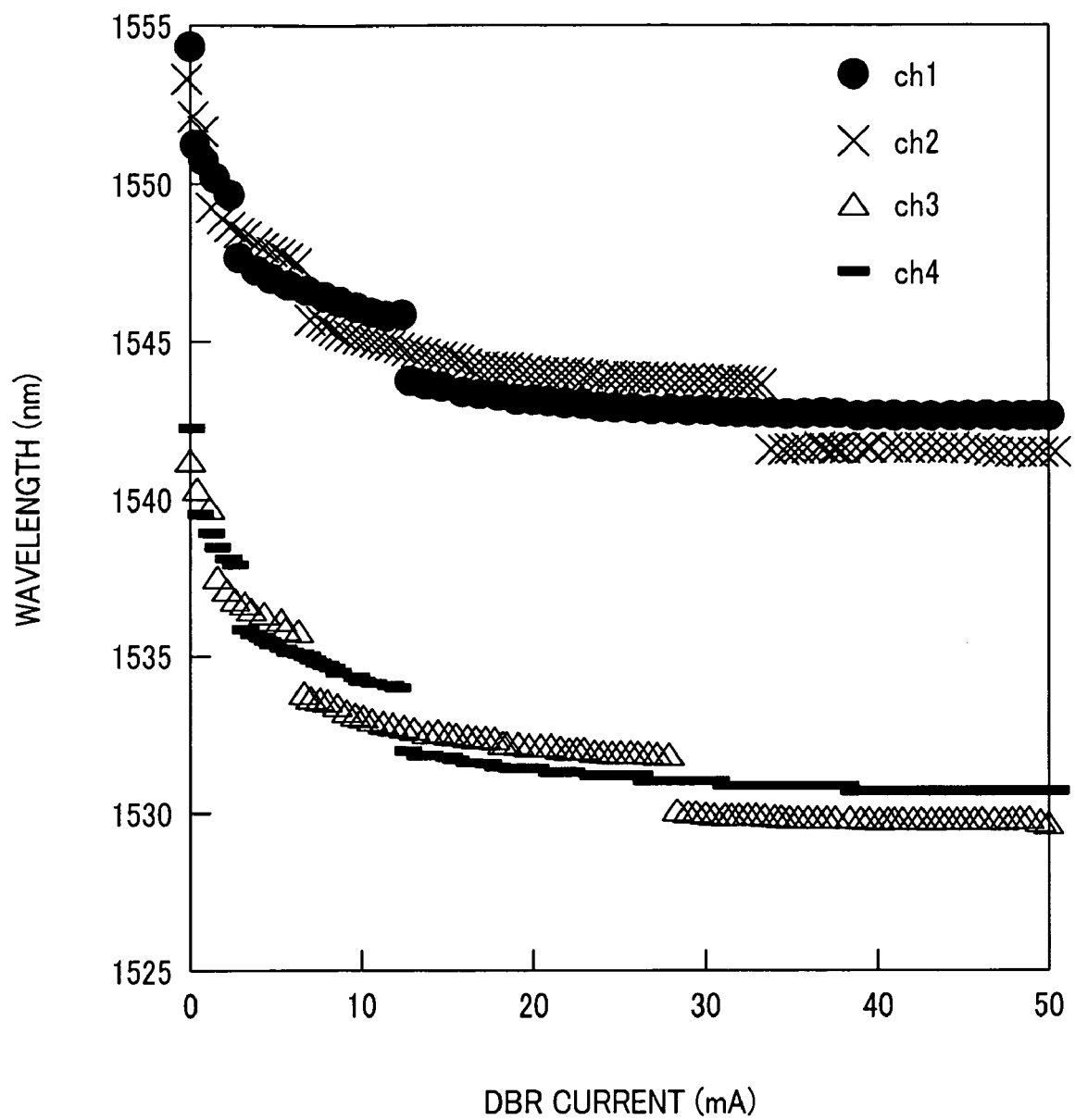
FIG. 14 is a diagram showing an exemplary relationship between the DBR current and the oscillation wavelength of the wavelength tunable semiconductor laser device according to the second embodiment of the present invention.

FIG. 14 shows the wavelength characteristics of a laser chip configured as described above. All of the four channels of this distributed Bragg reflector laser oscillated in a single axial mode at wavelengths within the 1550 nm band. The laser chip delivered a chip optical output of approximately 30 mW at a gain current of 20 mA and an SOA layer current of 200 mA. (This magnitude of optical output is large enough for optical communications.) When the DBR current was changed from 0 to 50 mA, the laser chip exhibited the following characteristics. The channels ch1 and ch2 together covered the wavelength range 1542.5 nm to 1554 nm (i.e., 11.5 nm wide), allowing the oscillation wavelength to be continuously varied over this range. This laser chip required a DBR current only approximately one-half of the DBR current required by conventional laser chips. Likewise, the channels ch3 and ch4 together covered the wavelength range 1531.5 nm to 1543 nm (i.e., 11.5 nm wide), allowing the oscillation wavelength to be continuously varied over this range. As a result, the laser chip achieved a continuous wavelength tunable range extending between 1531.5 nm and 1554 nm (i.e., 22.5 nm wide).

Third Embodiment

Figure 15:
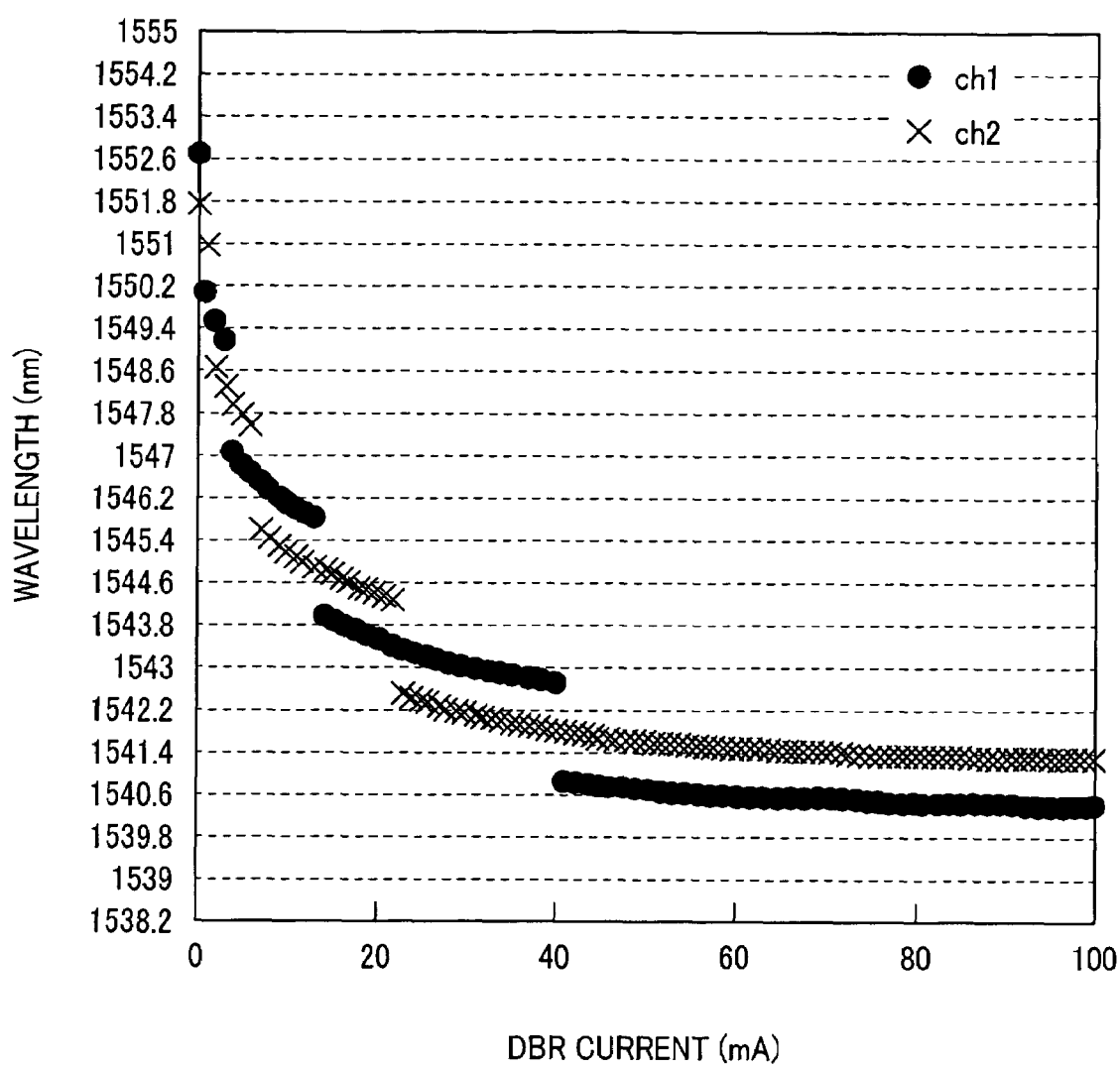
FIG. 15 is a diagram showing an exemplary relationship between the DBR current and the oscillation wavelength of a wavelength tunable semiconductor laser device according to a third embodiment of the present invention.

FIG. 15 shows the wavelength characteristics of a laser device adapted to generate a wavelength grid having a fixed pitch $\Delta\lambda_{GRID}$. The dimensions of the device and its manufacturing method were the same as those of the first embodiment. The basic structure of the device is similar to that shown in FIGS. 10, 11A, and 11B.

The following description will be directed primarily to the laser channels ch1 and ch2. In order to allow the channels ch1 and ch2 to achieve a grid pitch $\Delta\lambda_{GRID}$ of 0.8 nm and alternately cover two wavelength grid elements at a time, these channels were formed such that: Lgrt1=105 μm; Lgrt2=105.119 μm; Λ1=Λ2=0.238 μm; and κ1=κ2=κ3=κ4 =90 cm$^{-1}$. As a result, even though there are wavelength ranges that were not covered by either of the two channels, these channels alternately covered two wavelength grid elements at a time, and the resultant wavelength grid included 16 grid elements (from 1540.6 nm to 1552.6 nm).

Figure 16:
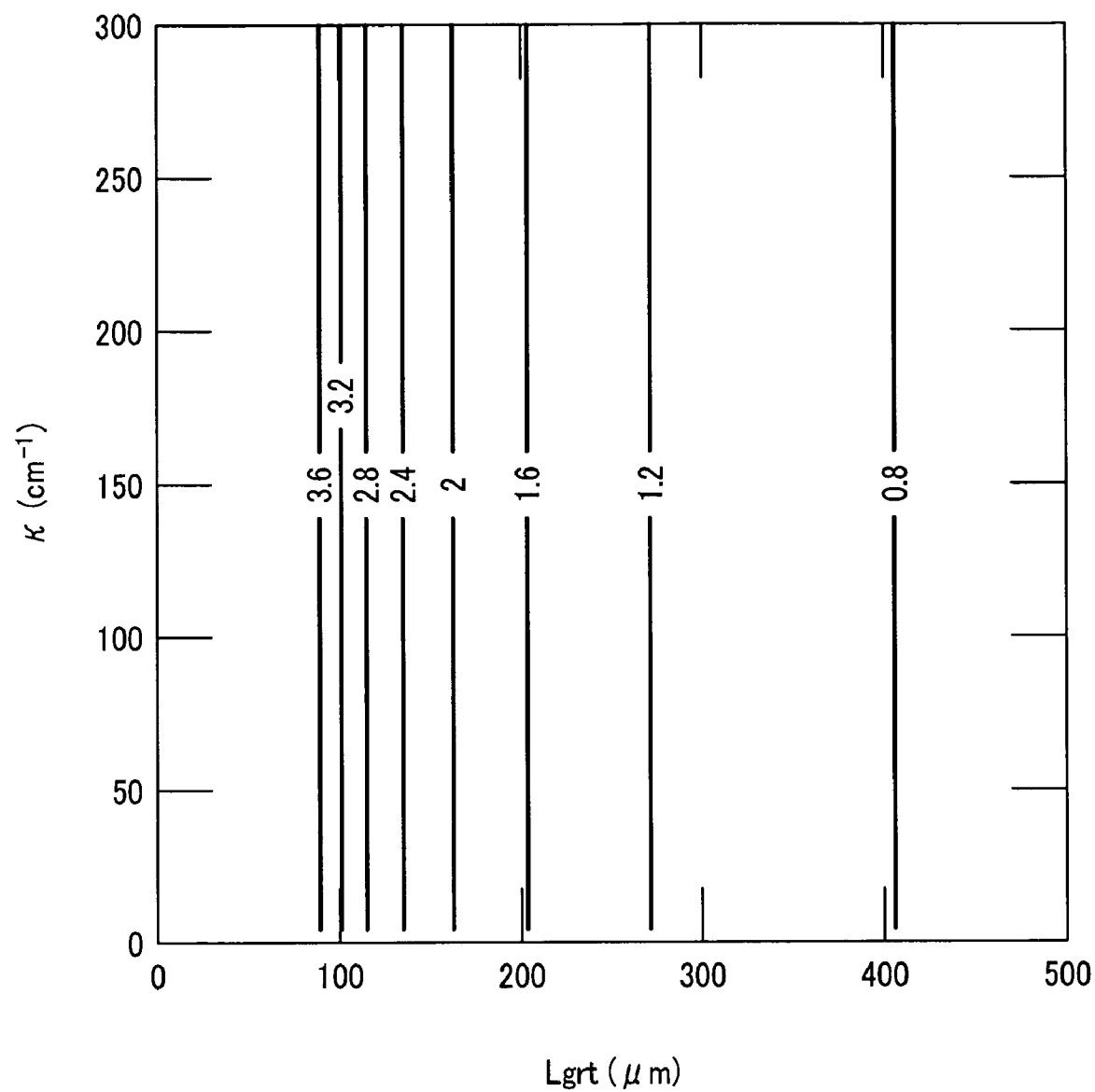
FIG. 16 is a contour map showing the dependence of a parameter $\Delta\lambda$total on a distance Lgrt and a coupling coefficient $\kappa$ in the wavelength tunable semiconductor laser device according to the third embodiment of the present invention.
Figure 17:
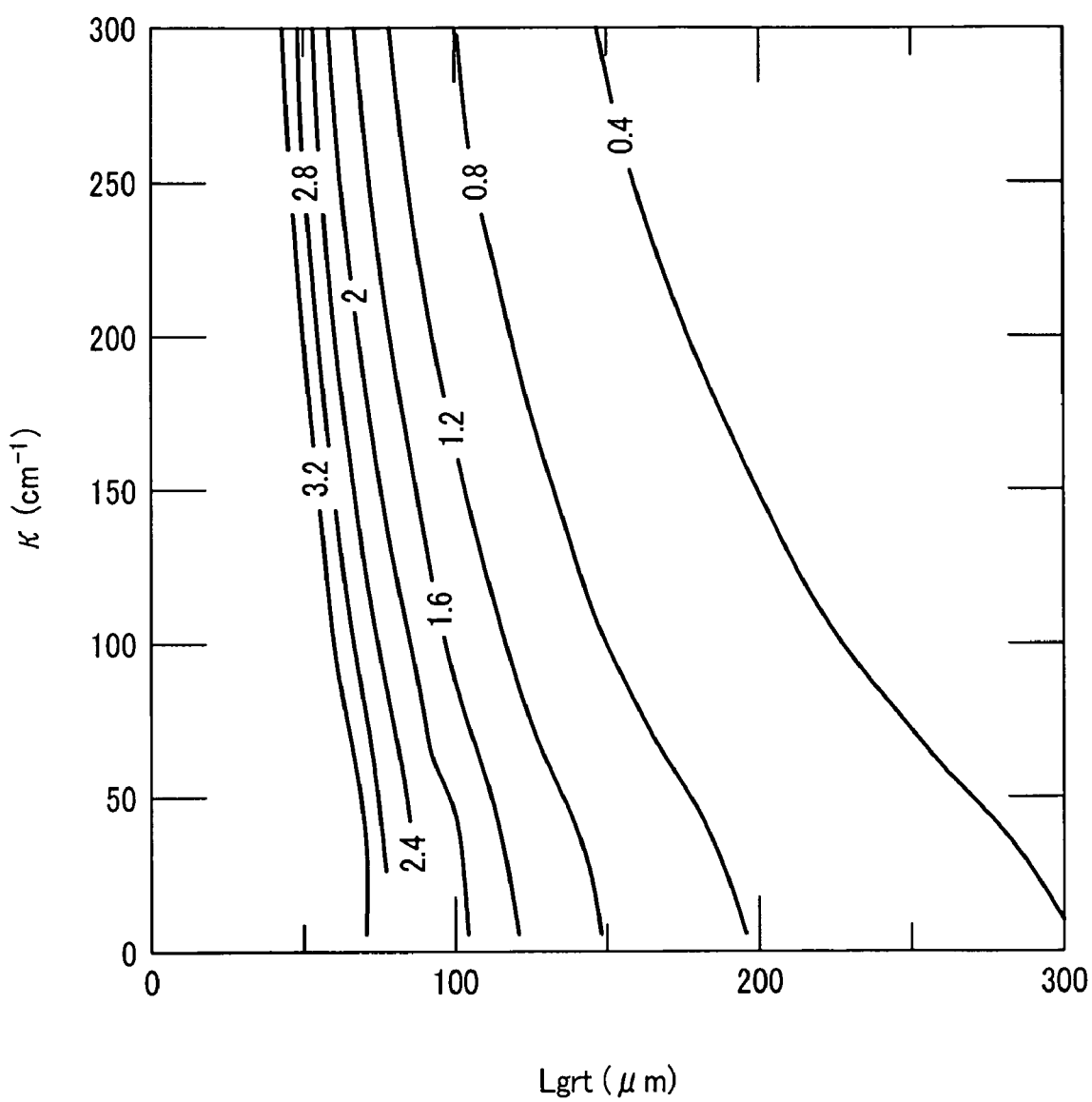
FIG. 17 is a contour map showing the dependence of a parameter $\Delta\lambda$con on the distance Lgrt and the coupling coefficient $\kappa$ in the wavelength tunable laser device according to the third embodiment of the present invention.

There will now be described how to determine the value of each parameter described above. To allow the laser channels ch1 and ch2 to achieve a grid pitch $\Delta\lambda_{GRID}$ of 0.8 nm and alternately cover two wavelength grid elements at a time, the sum (Δλtotal) of Δλcon and Δλhop must be 3.2 nm (that is, 0.8 nm×2×2). FIG. 16 is a contour map showing the dependence of Δλtotal on the distance Lgrt and the coupling coefficient κ. Each curve in the figure represents the contour at a particular value of Δλtotal, which is indicated on the curve. To set Δλtotal to 3.2 nm, Lgrt may be set to 105 μm. Then, the value of κ is determined so that Δλcon>0.8 nm. (This allows each channel to achieve continuous wavelength tunable ranges each covering two wavelength grid elements.) FIG. 17 is a contour map showing the dependence of Δλcon on Lgrt and κ. Each curve in the figure represents the contour at a particular value of Δλcon, which is indicated on the curve. As can be seen from the figure, if Δλcon>0.8 nm (and Lgrt=105 μm), then κ<250 cm$^{-1}$.

It should be noted that $\Delta\lambda_{GRID}$ may be set to 0.4 nm or 1.6 nm, instead of 0.8 nm. Further, although in the above example the laser channels ch1 and ch2 alternately cover two wavelength grid elements at a time, they may be adapted to alternately cover one or any plural number of wavelength grid elements at a time.

Thus, the present invention allows a semiconductor laser device to be formed such that the laser channels together cover a wide wavelength range over which the oscillation wavelength can be continuously varied, without using high accurate crystal growth and process techniques. Further, the active layer can be designed to have a large length, resulting in stable, high output laser oscillation. Further, the above preferred embodiments of the present invention enable the device performance and yield to be dramatically increased.

The following are reference numerals used in the drawings of this specification.

100 . . . chip substrate
101, 102, 103, 104 . . . gain electrode
105, 106, 107, 108 . . . DBR electrode
109, 110, 111, 112 . . . optical waveguide
113 . . . combiner
114 . . . SOA electrode
115, 116, 117, 118 . . . laser channel
131 . . . substrate
132, 133, 134, 135, 137, 171, 172, 173 . . . core region
136 . . . grating
150 . . . grating supply layer
160 . . . ungrated portion of grating supply layer
138 . . . rear DBR region
139 . . . gain region
140 . . . front DBR region
141 . . . S-shaped waveguide region
142 . . . MMI region
143 . . . SOA region
144, 145 . . . end face
146, 147 . . . end face coating film
151 . . . spacer
152 . . . cladding layer
153 . . . capping layer region
154 . . . distance between rear DBR region and gain region
155 . . . distance between front DBR region and gain region
156 . . . back electrode
161 . . . rear DBR electrode
162 . . . gain electrode
163 . . . front DBR electrode
164 . . . SOA electrode
201 . . . reflective film for laser oscillation
181, 182, 183, 184 . . . insulator film

What is claimed is:

1. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled;

wherein the oscillation wavelength of said first semiconductor laser portion can be continuously varied between wavelengths λ1 and λ2 and between wavelengths λ3 and λ4, where λ1<λ2<λ3<λ4; and wherein the oscillation wavelength of said second semiconductor laser portion can be continuously varied between wavelengths λ5 and λ6 that satisfy the relation: λ5<λ2<λ3<λ6;

said first semiconductor laser portion includes a first front DBR region, a first gain region, and a first rear DBR region arranged in series;

said first optical waveguide, said first front DBR region, said first gain region, and said first rear DBR region are adjacent each other in that order;

said second semiconductor laser portion includes a second front DBR region, a second gain region, and a second rear DBR region arranged in series;

said second optical waveguide, said second front DBR region, said second gain region, and said second rear DBR region are adjacent each other in that order; and the following equation is satisfied:

$$Lgrt2-\Lambda\times(1/10) \leq Lgrt1+\Lambda\times(N+1/2) \leq Lgrt2+\Lambda\times(1/10),$$

where:

Lgrt1 denotes the distance between a substantially center portion of the one of first rear grating elements closest to said first gain region and a substantially center portion of the one of first front grating elements closest to said first gain region, said first rear grating elements being formed in said first rear DBR region, said first front grating elements being formed in said first front DBR region;

Lgrt2 denotes the distance between a substantially center portion of the one of second rear grating elements closest to said second gain region and a substantially center portion of the one of second front grating elements closest to said second gain region, said second rear grating elements being formed in said second rear DBR region, said second front grating elements being formed in said second front DBR region;

Λ denotes the pitch of a first gating and a second grating, said first grating being made up of said first rear grating elements and said first front grating elements formed in said first rear DBR region and said first front DBR region, respectively, said second grating being made up of said second rear grating elements and said second front grating elements formed in said second rear DBR region and said second front DBR region, respectively; and N denotes an integer.

2. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled;

wherein the oscillation wavelength of said first semiconductor laser portion can be continuously varied between wavelengths λ1 and λ2 and between wavelengths λ3 and λ4, where λ1<λ2<λ3<λ4; and wherein the oscillation wavelength of said second semiconductor laser portion can be continuously varied between wavelengths λ5 and λ6 that satisfy the relation: λ5<λ2<λ3<λ6;

said first semiconductor laser portion includes a first front DBR region, a first gain region, and a first semiconductor end face arranged in series, said first semiconductor end face having a reflective film coating thereon;

said first optical waveguide, said first front DBR region, said first gain region, and said first semiconductor end face are adjacent each other in that order;

said second semiconductor laser portion includes a second front DBR region, a second gain region, and a second semiconductor end face arranged in series, said second semiconductor end face having a reflective film coating thereon;

said second optical waveguide, said second front DBR region, said second gain region, and said second semiconductor end face are adjacent each other in that order; and the following equation is satisfied:

$Lgrt2 - \Lambda \times (1/10) \leq Lgrt1 + \Lambda \times (N+1/2) \leq Lgrt2 + \Lambda \times (1/10)$, where:

Lgrt1 denotes the distance between said first semiconductor end face and a substantially center portion of the one of first front grating elements closest to said first gain region, said first front grating elements being formed in said first front DBR region;

Lgrt2 denotes the distance between said second semiconductor end face and a substantially center portion of the one of second front grating elements closest to said second gain region, said second front grating elements being formed in said second front DBR region;

Λ denotes the pitch of a first grating and a second grating, said first grating being made up of said first front grating elements formed in said first front DBR region, said second grating being made up of said second front grating elements formed in said second front DBR region; and N denotes an integer.

3. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled;

wherein the oscillation wavelength of said first semiconductor laser portion can be continuously varied between wavelengths λ1 and λ2 and between wavelengths λ3 and λ4, where λ1<λ2<λ3<λ4; and wherein the oscillation wavelength of said second semiconductor laser portion can be continuously varied between wavelengths λ5 and λ6 that satisfy the relation: λ5<λ2<λ3<λ6;

wherein said first and second semiconductor laser portions are controlled such that when said first semiconductor laser portion oscillates, said second semiconductor laser portion does not oscillate, and vice versa.

4. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled;

wherein the oscillation wavelength of said first semiconductor laser portion can be continuously varied between wavelengths λ1 and λ2 and between wavelengths λ3 and λ4, where λ1<λ2<λ3<λ4; and wherein the oscillation wavelength of said second semiconductor laser portion can be continuously varied between wavelengths λ5 and λ6 that satisfy the relation: λ5<λ2<λ3<λ6;

having an oscillation wavelength range extending between 1250 nm and 1620 nm (a communication wavelength range).

5. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled; and wherein said first semiconductor laser portion is adapted to be able to oscillate at wavelengths $\lambda_{Grid(1)}$, $\lambda_{Grid(2)}$, ..., $\lambda_{Grid(M)}$ and at wavelengths $\lambda_{Grid(2M+1)}$, $\lambda_{Grid(2M+2)}$, ... $\lambda_{Grid(3M)}$, and said second semiconductor laser portion is adapted be able to oscillate at wavelengths $\lambda_{Grid(M+1)}$, $\lambda_{Grid(M+2)}$, ..., $\lambda_{Grid(2M)}$, where: M denotes an integer; $\lambda_{Grid(1)} \leq \lambda_{Grid(2)} \leq ... \leq \lambda_{Grid(3M)}$; and $\lambda_{Grid(2)} - \lambda_{Grid(1)} = \lambda_{Grid(3)} - \lambda_{Grid(2)} = ... = \lambda_{Grid(3M)} - \lambda_{Grid(3M-1)} = \Delta\lambda_{Grid}$;

said first semiconductor laser portion includes a first front DBR region, a first gain region, and a first rear DBR region arranged in series;

said first optical waveguide, said first front DBR region, said first gain region, and said first rear DBR region are adjacent each other in that order;

said second semiconductor laser portion includes a second front DBR region, a second gain region, and a second rear DBR region arranged in series;

said second optical waveguide, said second front DBR region, said second gain region, and said second rear DBR region are adjacent each other in that order; and the following equation is satisfied:

$$Lgrt2 - \Lambda \times (1/10) \leq Lgrt1 + \Lambda \times (N+1/2) \leq Lgrt2 + \Lambda \times (1/10),$$
where:

Lgrt1 denotes the distance between a substantially center portion of the one of first rear grating elements closest to said first gain region and a substantially center portion of the one of first front grating elements closest to said first gain region, said first rear grating elements being formed in said first rear DBR region, said first front grating elements being formed in said first front DBR region;

Lgrt2 denotes the distance between a substantially center portion of the one of second rear grating elements closest to said second gain region and a substantially center portion of the one of second front grating elements closest to said second gain region, said second rear grating elements being formed in said second rear DBR region, said second front grating elements being formed in said second front DBR region;

Λ denotes the pitch of a first grating and a second grating, said first grating being made up of said first rear grating elements and said first front grating elements formed in said first rear DBR region and said first front DBR region, respectively, said second grating being made up of said second rear grating elements and said second front grating elements formed in said second rear DBR region and said second front DBR region, respectively; and N denotes an integer.

6. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled; and wherein said first semiconductor laser portion is adapted to be able to oscillate at wavelengths $\lambda_{Grid(1)}$, $\lambda_{Grid(2)}, \ldots \lambda_{Grid(M)}$ and at wavelengths $\lambda_{Grid(2M+1)}$, $\lambda_{Grid(2M+2)}, \ldots \lambda_{Grid(3M)}$, and said second semiconductor laser portion is adapted be able to oscillate at wavelengths $\lambda_{Grid(M+1)}$, $\lambda_{Grid(M+2)}, \ldots \lambda_{Grid(2M)}$, where: M denotes an integer: $\lambda_{Grid(1)} < \lambda_{Grid(2)} < \ldots < \lambda_{Grid(3M)}$; and $\lambda_{Grid(2)} - \lambda_{Grid(1)} = \lambda_{Grid(3)} - \lambda_{Grid(2)} = \ldots = \lambda_{Grid(3M)} - \lambda_{Grid(3M-1)} = \Delta\lambda_{GRID}$;

said first semiconductor laser portion includes a first front DBR region, a first gain region, and a first semiconductor end face arranged in series, said first semiconductor end face having a high reflective film coating thereon;

said first optical waveguide, said first front DBR region, said first gain region, and said first semiconductor end face are adjacent each other in that order;

said second semiconductor laser portion includes a second front DBR region, a second gain region, and a second semiconductor end face arranged in series, said second semiconductor end face having a high reflective film coating thereon;

said second optical waveguide, said second front DBR region, said second gain region, and said second semiconductor end face are adjacent each other in that order; and the following equation is satisfied:

$$Lgrt2 - \Lambda \times (1/10) \leq Lgrt1 + \Lambda \times (N+1/2) \leq Lgrt2 + \Lambda \times (1/10),$$
where:

Lgrt1 denotes the distance between said first semiconductor end face and a substantially center portion of the one of first front grating elements closest to said first gain region, said first front grating elements being formed in said first front DBR region;

Lgrt2 denotes the distance between said second semiconductor end face and a substantially center portion of the one of second front grating elements closest to said second gain region, said second front grating elements being formed in said second front DBR region;

Λ denotes the pitch of a first grating and a second grating, said first grating being made up of said first front grating elements formed in said first front DBR region, said second grating being made up of said second front grating elements formed in said second front DBR region; and N denotes an integer.

7. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled; and wherein said first semiconductor laser portion is adapted to be able to oscillate at wavelengths $\lambda_{Grid(1)}$, $\lambda_{Grid(2)}, \ldots \lambda_{Grid(M)}$ and at wavelengths $\lambda_{Grid(2M+1)}$, $\lambda_{Grid(2M+2)}, \ldots \lambda_{Grid(3M)}$, and said second semiconductor laser portion is adapted be able to oscillate at wavelengths $\lambda_{Grid(M+1)}$, $\lambda_{Grid(M+2)}, \ldots \lambda_{Grid(2M)}$, where: M denotes an integer: $\lambda_{Grid(1)} < \lambda_{Grid(2)} < \ldots < \lambda_{Grid(3M)}$; and $\lambda_{Grid(2)} - \lambda_{Grid(1)} = \lambda_{Grid(3)} - \lambda_{Grid(2)} = \ldots = \lambda_{Grid(3M)} - \lambda_{Grid(3M-1)} = \Delta\lambda_{GRID}$;

wherein said first and second semiconductor laser portions are controlled such that when said first semiconductor laser portion oscillates, said second semiconductor laser portion does not oscillate, and vice versa.

8. A wavelength tunable semiconductor laser device, comprising:

a first semiconductor laser portion and a second semiconductor laser portion;

a first optical waveguide and a second optical waveguide connected to outputs of said first and second semiconductor laser portions, respectively; and an optical combiner for combining light waves output from said first and second optical waveguides;

wherein the oscillation wavelengths of said first and second semiconductor laser portions can be controlled; and wherein said first semiconductor laser portion is adapted to be able to oscillate at wavelengths $\lambda_{Grid(1)}$, $\lambda_{Grid(2)}$, ... $\lambda_{Grid(M)}$ and at wavelengths $\lambda_{Grid(2M+1)}$, $\lambda_{Grid(2M+2)}$, ... $\lambda_{Grid(3M)}$, and said second semiconductor laser portion is adapted be able to oscillate at wavelengths $\lambda_{Grid(M+1)}$, $\lambda_{Grid(M+2)}$, ... $\lambda_{Grid(2M)}$, where: M denotes an integer: $\lambda_{Grid(1)} < \lambda_{Grid(2)} < \ldots < \lambda_{Grid(3M)}$; and $\lambda_{Grid(2)} - \lambda_{Grid(1)} = \lambda_{Grid(3)} - \lambda_{Grid(2)} = \ldots = \lambda_{Grid(3M)} - \lambda_{Grid(3M-1)} = \Delta\lambda_{GRID}$;

having an oscillation wavelength range extending between 1250 nm and 1620 nm (a communication wavelength range).

* * * * *